(12) United States Patent
Ventzek et al.

(10) Patent No.: US 10,998,169 B2
(45) Date of Patent: May 4, 2021

(54) SYSTEMS AND METHODS OF CONTROL FOR PLASMA PROCESSING

(71) Applicant: Tokyo Electron Limited, Tokyo (JP)

(72) Inventors: Peter Ventzek, Austin, TX (US); Zhiying Chen, Austin, TX (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/221,971

(22) Filed: Dec. 17, 2018

(65) Prior Publication Data

US 2020/0058470 A1 Feb. 20, 2020

Related U.S. Application Data

(60) Provisional application No. 62/718,454, filed on Aug. 14, 2018, provisional application No. 62/724,879, filed on Aug. 30, 2018.

(51) Int. Cl.
| | |
|---|---|
| *C23C 16/455* | (2006.01) |
| *H01L 21/3065* | (2006.01) |
| *H01L 21/67* | (2006.01) |
| *H01L 21/683* | (2006.01) |
| *H01J 37/32* | (2006.01) |

(52) U.S. Cl.
CPC .. *H01J 37/32146* (2013.01); *C23C 16/45536* (2013.01); *H01J 37/3211* (2013.01); *H01L 21/3065* (2013.01); *H01L 21/67069* (2013.01); *H01L 21/6831* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 5,304,282 A | 4/1994 | Flamm | |
| 5,928,528 A * | 7/1999 | Kubota | H01J 37/32706 216/67 |
| 8,735,291 B2 | 5/2014 | Ranjan et al. | |
| 9,159,575 B2 | 10/2015 | Ranjan et al. | |
| 9,514,967 B2 * | 12/2016 | Ohgoshi | H01L 21/67069 |

(Continued)

FOREIGN PATENT DOCUMENTS

KR 20120027159 A 3/2012

OTHER PUBLICATIONS

Ken Tokashiki et al. "Synchronous Pulse Plasma Operation upon Source and Bias Radio Frequencys for Inductively Coupled Plasma for Highly Reliable Gate Etching Technology", Japanese Journal of Applied Physics 48 (2009) 08HD01.

(Continued)

*Primary Examiner* — Allan W. Olsen
(74) *Attorney, Agent, or Firm* — Slater Matsil, LLP

(57) ABSTRACT

A method of plasma processing includes generating a first sequence of source power pulses, generating a second sequence of bias power pulses, combining the bias power pulses of the second sequence with the source power pulses of the first sequence to form a combined sequence of alternating source power pulses and bias power pulses, and, using the combined sequence, generating a plasma comprising ions and processing a substrate by delivering the ions to a major surface of the substrate.

20 Claims, 16 Drawing Sheets

(56) References Cited

U.S. PATENT DOCUMENTS

| | | | |
|---|---|---|---|
| 9,570,313 B2 | 2/2017 | Ranjan et al. | |
| 9,583,357 B1* | 2/2017 | Long | H01J 37/321 |
| 9,726,621 B1 | 8/2017 | Bahr | |
| 9,870,898 B2* | 1/2018 | Urakawa | H01J 37/32174 |
| 2001/0051438 A1* | 12/2001 | Shin | H01J 37/32137 438/706 |
| 2002/0115301 A1* | 8/2002 | Savas | H01J 37/32082 438/710 |
| 2002/0160125 A1* | 10/2002 | Johnson et al. | H01J 37/3244 427/569 |
| 2006/0121704 A1 | 6/2006 | Walther et al. | |
| 2008/0317965 A1 | 12/2008 | Son et al. | |
| 2009/0255800 A1 | 10/2009 | Koshimizu | |
| 2009/0294062 A1 | 12/2009 | Shannon et al. | |
| 2010/0130018 A1* | 5/2010 | Tokashiki | H01J 37/32082 438/710 |
| 2010/0248488 A1* | 9/2010 | Agarwal | H01J 37/32091 438/714 |
| 2010/0273332 A1 | 10/2010 | Edelberg | |
| 2011/0139748 A1* | 6/2011 | Donnelly | H01J 37/32036 216/37 |
| 2011/0143537 A1 | 6/2011 | Lee et al. | |
| 2013/0105443 A1 | 5/2013 | Banna et al. | |
| 2014/0118031 A1 | 5/2014 | Rughoonundon et al. | |
| 2014/0273487 A1 | 9/2014 | Deshmukh et al. | |
| 2017/0098527 A1* | 4/2017 | Kawasaki | H01J 37/32091 |
| 2017/0099722 A1 | 4/2017 | Kawasaki et al. | |
| 2017/0103873 A1* | 4/2017 | Kawasaki | H01J 37/32155 |
| 2017/0186586 A1 | 6/2017 | Oh et al. | |
| 2017/0229312 A1* | 8/2017 | Park | H01L 21/67069 |

OTHER PUBLICATIONS

Samer Banna et al. "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009.

K Niazi, A J Lichtenberg, MA Lieberman, and DL Flamm, "Operation of a helical resonator plasma source", Plasma Sources Sci. Technol. 3 (1994) 482-495.

John H Keller, "New and possible future trends in inductively coupled plasmas (ICPs) for semiconductor processing", Plasma Phys. Control. Fusion 39 (1997) A437-A443.

John H Keller, "Inductive plasmas for plasma processing", Plasma Sources Sci. Technol. 5 (1996) 166-172.

R BR Piejak, V A Godyak and B M Alexandrovich, "A simple analysis of an inductive RF discharge", Plasma Sources Sci. Technol. 1 (1992) 179-186.

G. Carter, and J.S. Colligon, "Ion Bombardment of Solids", American Elsevier Publishing, Inc. (1968) 30-75.

\* cited by examiner

SYSTEMS AND METHODS OF CONTROL FOR PLASMA PROCESSING

CROSS-REFERENCE TO RELATED APPLICATIONS

This application claims priority to U.S. Provisional Application No. 62/718,454, filed on Aug. 14, 2018 and U.S. Provisional Application No. 62/724,879, filed on Aug. 30, 2018, which applications are hereby incorporated by reference in their entirety.

This application is related to U.S. patent application Ser. No. 16/219,535, filed Dec. 13, 2018 which also claims priority to U.S. Provisional Application No. 62/718,454, filed on Aug. 14, 2018 and U.S. Provisional Application No. 62/724,879, filed on Aug. 30, 2018.

TECHNICAL FIELD

The present invention relates generally to plasma processing, and, in particular embodiments, to systems and methods of control for plasma processing.

BACKGROUND

Device formation within microelectronic workpieces may involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes.

Plasma processes are commonly used to form devices in microelectronic workpieces. For example, plasma etching and plasma deposition are common process steps during semiconductor device fabrication. A combination of source power and bias power may be used to generate and direct plasma during plasma processing. FIG. 18 illustrates conventional timing diagrams for the application of source power and bias power during plasma processing. In the top diagram, there are no distinct pulses for the source power or the bias power. In the middle diagram, continuous bias power is applied with no pulses while source pulses are applied. In the bottom diagram, continuous source power is applied with no pulses while bias pulses are applied.

SUMMARY

In accordance with an embodiment of the invention, a method of plasma processing includes generating a first sequence of source power pulses, generating a second sequence of bias power pulses, combining the bias power pulses of the second sequence with the source power pulses of the first sequence to form a combined sequence of alternating source power pulses and bias power pulses, and, using the combined sequence, generating a plasma comprising ions and processing a substrate by delivering the ions to a major surface of the substrate.

In accordance with another embodiment, a method of plasma processing includes providing source power to a plasma processing chamber to generate a plasma. The source power includes a plurality of source power pulses. The method further includes providing bias power comprising a plurality of bias power pulses to the plasma processing chamber. The plurality of source power pulses and the plurality of bias power pulses are combined to form a pulse sequence. Each pulse of the pulse sequence comprises a source power pulse of the plurality of source power pulses, a bias power pulse of the plurality of bias power pulses, and an interval of time during which either a portion of the SP pulse or a portion of the BP pulse is in a high amplitude state.

In accordance with still another embodiment of the invention, a plasma processing system includes a controller configured to generate a first sequence of source power pulses and a second sequence of bias power pulses. The controller is further configured to combine the bias power pulses of the second sequence with the source power pulses of the first sequence to form a combined sequence of alternating source power pulses and bias power pulses. The plasma processing system further includes a plasma processing chamber coupled to the controller and configured to generate a plasma including ions generated using the combined sequence. The plasma processing chamber is configured to support a substrate for receiving the generated ions.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
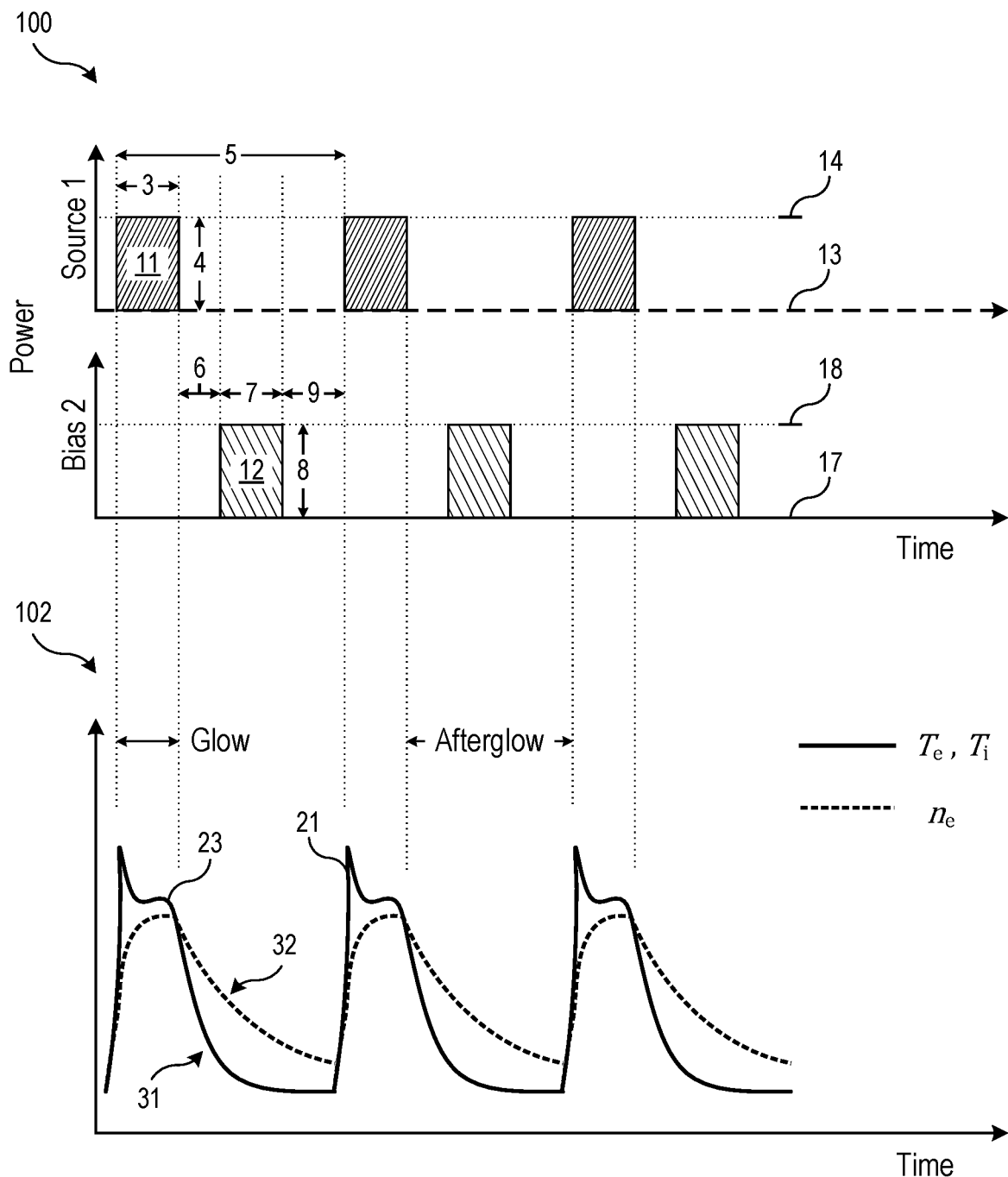
FIG. 1 illustrates a schematic timing diagram of a pulse sequence and a corresponding qualitative graph of an example method of control for plasma processing that includes source power pulses and bias power pulse in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Ion energy and ion angle may affect the quality, uniformity, selectivity, and predictability for a variety of plasma processes. The generation of perfectly unidirectional, vertical ion beams may be desirable, for example, to achieve anisotropic etching of high aspect ratio features. In addition, the ability to adjust, correct, and control these directional ions using manipulated angular distributions of ions may also be desirable. Such manipulated angular ion distributions, for example, could be useful for formation of contacts, fins, gate lines, other front-end or back-end processing, and general patterning steps as well as other processes.

However, it is widely accepted that no active control mechanism exists in the art to control the angle of ions incident on a topographical feature of a microelectronic device during plasma processing. It may be beneficial to deliver absolutely vertical or substantially vertical ions to substrate surface. Additionally, it may also be beneficial to control the angle of ion beams delivered into structures while accounting for and/or correcting for scattering on sidewalls of patterned structures. For example, this control of ion distribution angle could be useful for high aspect ratio contact (HARC) type etches and patterning applications as well as other etch/deposition processes.

As described herein, embodiments are provided that control ion angular distribution for plasma processing of microelectronic workpieces (or substrate). The disclosed embodiments control the application of alternating current (AC) power and/or the application of pulsed direct current (DC) power to a microelectronic workpiece (e.g., semiconductor wafer) during plasma processing. Through these techniques, the disclosed embodiments may provide various advantages including control of angular distributions for ions being delivered to the microelectronic workpiece. Additional implementations and advantages may also be apparent to one of skill in the art in view of the following description.

In various embodiments, a method of processing a microelectronic workpiece includes providing source power to a plasma processing chamber to generate plasma. The plasma may, for example, be used for plasma processes such as etching, deposition, cleaning, ashing, and the like. The source power provided to the plasma processing chamber is pulsed. Specifically, pulsing power to the plasma processing chamber may include alternating power between an on-state and an off-state thereby forming a series of temporally distinct pulses. The method further includes providing bias power to the plasma processing chamber. The bias power may accelerate charged particles in the generated plasma towards the microelectronic workpiece disposed in the plasma processing chamber. The bias power provided to the plasma processing chamber is also pulsed. However, the source power pulses and the bias power pulses are at least partially non-overlapping in time.

Various embodiments described herein provide systems and methods to control ion angular distribution as well as ion energy for the delivery of ions to a surface for plasma processing such as in reactive ion etching or plasma deposition. These control techniques for ion angular distribution may also be helpful for atomic layer level etch (ALE) and atomic layer-deposition (ALD) as well as spatial ALE/ALD and/or other processes. Various embodiments as described herein provide antiphased, antisynchronous, and/or out-of-phase source power and bias power pulsing. In addition, these techniques may be further augmented by incorporating one or more additional mechanisms for controlling the plasma potential. These additional mechanisms may also be pulsed in a delayed manner from the source plasma or at the same time as the source plasma. Various plasma properties such as ion temperature ($T_i$), electron temperature ($T_e$), electron density ($n_e$), sheath voltage drop ($V_s$), and the like may be modulated and controlled using the embodiments as described herein.

Embodiments provided below describe various systems and methods of operating plasma processing systems, and in particular, methods of control for plasma processing that include source power pulses and bias power pulses. The following description describes the embodiments. An example schematic timing diagram and a qualitative graph of an embodiment method of control for plasma processing that includes source power pulses and bias power pulses are described using FIG. 1. An embodiment plasma processing system including a source pulse modulation circuit and a pulse modulation timing circuit is described using FIG. 2. Two example schematic timing diagrams of embodiment methods of control for plasma processing including antisynchronous bias power pulses are described using FIG. 3. Several example schematic timing diagrams of embodiment methods of control for plasma processing which illustrate a single cycle including one source power pulse and one bias power pulse are described using FIGS. 4-7. An embodiment plasma processing system including a plasma potential coupling element and a corresponding schematic timing diagram of an embodiment method are described using FIGS. 8 and 9. An embodiment plasma processing system including an electron beam source and a corresponding schematic timing diagram of an embodiment method are described using FIGS. 10 and 11. An embodiment plasma processing system including an electrically conductive grid and a corresponding schematic timing diagram of an embodiment method are described using FIGS. 12 and 13. An example flowchart of an embodiment method of generating a control law usable for actively controlling an ion angular distribution function (IADF) during plasma processing is described using FIG. 14. An example flowchart of an embodiment method of feedforward control of a plasma process is described using FIG. 15. Two embodiment methods are described using FIGS. 16 and 17.

FIG. 1 illustrates a schematic timing diagram of a pulse sequence and a corresponding qualitative graph of an example method of control for plasma processing that includes source power pulses and bias power pulses in accordance with an embodiment of the invention. The source power is coupled to a plasma processing chamber of a plasma processing system and is used to generate a plasma for processing of a microelectronic workpiece. The bias power is also coupled to the plasma processing chamber and may be used to accelerate ions toward a surface of the microelectronic workpiece in addition to other functions.

Referring to FIG. 1, a timing diagram 100 includes a source power 1 and a bias power 2 which are pulsed to generate and deliver ions to a microelectronic workpiece (e.g., a semiconductor wafer). Specifically, timing diagram 100 includes a pulse sequence with one or more source power (SP) pulses 11 and bias power (BP) pulses 12 which are at least partially non-overlapping in time. For example, the source power 1 may be AC power which is switched between an on state and an off state to generate the SP pulses 11 (the frequency of the AC power is higher than the frequency of the SP pulses 11). Similarly, the bias power 2 may also be AC power. For example, the bias power 2 may be implemented as RF power and may have a DC self-bias. Alternatively, one or both of the source power 1 and the bias power 2 may be DC power.

In various embodiments, the pulse sequence is periodic with a pulse modulation period 5 and includes multiple SP pulses 11 and BP pulses 12. However, in some cases, a pulse sequence may refer to a single SP pulse and a single BP pulse. Further, although periodicity may be beneficial, there is no strict requirement that the pulse sequence be periodic or that the SP pulses have the same period as the BP pulses.

As shown in graph 102, the temperature curve 31 and the density curve 32 of the generated plasma change in accordance with the applied source power 1 of timing diagram 100. SP pulses 11 generate a plasma glow phase characterized by an increase in various plasma parameters such as the electron density $n_e$, electron temperature $T_e$, and the ion temperature $T_i$. Initial application of an SP pulse 11 may result in a spike 21 in plasma temperature (e.g., $T_e$ and $T_i$) which relaxes to a pseudo-equilibrium state 23 for the remainder of the SP pulse. After the SP pulse ends, the plasma enters an afterglow phase during which the ions and electrons may cool down resulting in decreases in $T_e$, $T_i$. The electrons and ions diffuse to the walls by ambipolar diffusion resulting in decreases in $n_e$. In various embodiments, during the afterglow phase, a BP pulse is applied to accelerate ions toward a surface of a microelectronic workpiece.

As illustrated in graph 102, $T_e$ and $T_i$ may decrease more rapidly than $n_e$ in the afterglow phase. Since the electron density $n_e$ is correlated with available ions, applications of a BP pulse during the afterglow phase may be particularly effective in order to accelerated low-temperature ions to the surface of the microelectronic workpiece. During the afterglow phase, the plasma current may also decrease. This current drop may allow for a large voltage difference $V_p$ across the plasma sheath $V_{DC}$ (RF DC self-bias voltage) in the afterglow phase when a bias power is applied (e.g., using a BP pulse). The increased voltage difference $V_p$ and the time-average DC voltage drop $V_{DC}$ along with the lower ion temperature may improve the directionality of the ion flux.

Therefore, the SP pulses and BP pulses are at least partially non-overlapping in time. In various embodiments, the SP pulses and BP pulses are completely out-of-phase as illustrated in the timing diagram boo. In other embodiments, the SP pulses and BP pulses may partially overlap. Accordingly, embodiments of the method include both a nonzero interval of time during which the source power 1 is applied without the bias power 2, as well as including a nonzero interval of time during which the bias power 2 is applied without the source power 1.

In some cases, it may be considered advantageous to deliver substantially vertical ions to the surface being processed. The average deviation of the incident angle of ions at the surface may be referred to as angular spread. Angular spread may be caused by scattering of ions in a plasma sheath as well as by random thermal motion of ions within the plasma prior to their acceleration through the plasma sheath toward the surface. Narrowing of the angular spread may be achieved by directionality derived from an electric field present in the plasma sheath while random thermal motion may result in broadening of the angular spread. One method of generating an electric field in the plasma sheath may be to apply bias power. In general, the angular spread $\langle \theta \rangle$ for a given ion angular distribution may be described by the following proportionality equation:

$$\langle \theta \rangle \propto \sqrt{\frac{T_i}{V_{DC}}} \quad (1)$$

As can be seen from Eq. (1), as the ion temperature $T_i$ increases, the angular spread $\langle \theta \rangle$ increases resulting in less vertical ions. Similarly, according to Eq. (1), as the bias voltage $V_{DC}$ increases the angular spread $\langle \theta \rangle$ decreases resulting in more vertical ions. Therefore, it may be advantageous to apply bias power 2 to the plasma processing chamber when $T_i$ is relatively low in order to increase the verticality of ions at the workpiece surface. It should be noted that in Eq. 1 the ion temperature $T_i$ is typically expressed in electron volts (eV) while the bias voltage $V_{DC}$ is expressed in volts (V) which conveniently allows the charge of an ion (+1) to be omitted from the denominator of Eq. (1).

Still referring to FIG. 1, the pulse sequence of timing diagram 100 may be defined by pulse modulation process parameters. The pulse modulation process parameters may include SP pulse width 3 and SP pulse amplitude 4 corresponding to the source power 1 sequence as well as a leading edge bias offset 6, BP pulse width 7, BP pulse amplitude 8, and a trailing edge bias offset 9 corresponding to the bias power 2 sequence. In particular, each SP pulse 11 includes an SP pulse width 3 and a SP pulse amplitude 4 while each BP pulse 12 includes a BP pulse width 7 and a BP pulse amplitude 8. It should be mentioned that unless otherwise noted, amplitude as used herein refers to the average peak-to-peak amplitude of a given pulse.

As shown in FIG. 1, the SP pulses 11 and the BP pulses 12 may be completely non-overlapping in time. In this specific case, the SP pulse width 3 is an interval of time during which the source power 1 is applied as a SP pulse without the bias bower 2 while the BP pulse width 7 is an interval of time during which the bias power 2 is applied as a BP pulse without the source power 1. In embodiments where the SP pulses 11 and the BP pulses 12 are partially non-overlapping, the intervals of time which are non-overlapping may include portions of the SP pulse width 3 and/or BP pulse width 7.

For both the SP pulses 11 and BP pulses 12, a specific pulse width may be implemented by choosing a duty cycle (%) for a given pulse modulation period 5. For example, if the pulse modulation period is set to 150 μs, a 56% source power duty cycle (%) and a 28% bias power duty cycle (%) would result in an 84 μs SP pulse width and a 42 μs BP pulse width. In one embodiment, the source power 1 and the bias power 2 have the same pulse modulation period. Alternatively, source power 1 and bias power 2 may operate with separate pulse modulation period.

The flux of ions and/or other radicals to the surface of a microelectronic workpiece may advantageously be controlled using the off-time of the SP pulses 11. For example, the inventors have discovered that a constant radical flux can be maintained when the SP off-time (6/7/9) is set to less than $L^2/sD$ where L is the critical dimension of a plasma processing chamber, D is the diffusion coefficient of the species for which the constant flux is maintained, and s is the sticking coefficient of the species. For example, L may be the distance between the location where the ions/radicals are created and the nearest wall. In one embodiment, L is the distance between the source region (i.e., location where the ions/radicals are born) and a SP coupling element. In various embodiments, adjustment of the SP off-time may increase or decrease the flux of ions and/or other radicals to a workpiece surface.

As illustrated in FIG. 1, a delay between SP pulses 11 and BP pulses 12 may be referred to as a leading edge bias offset 6. The leading edge bias offset 6 may be implemented as a percentage of the pulse modulation period 5. For example, the leading edge bias offset may vary between −10% to +10% of the pulse modulation period 5. Alternatively, the leading edge bias offset 6 may set as a specific time value. For example, continuing the above case where the source power 1 and the bias power 2 have the same pulse modulation period set to 150 μs, a leading edge bias offset of 10% would result in a 15 μs delay between the trailing edge of an SP pulse and a BP pulse. In the foregoing example, the leading edge bias offset 6 is set to be positive. However, the leading edge bias offset 6 may also be zero or negative.

Similarly, a delay between BP pulses 12 and SP pulses 11 may be referred to as a trailing edge bias offset 9 and may be implemented through a combination of the SP pulse width 3, the leading edge bias offset 6, and the BP pulse width 7. Continuing the above example, a 56% source power duty cycle (%), a leading edge bias offset of 10%, and a 28% bias power duty cycle (%) accounts for 94% of a complete pulse modulation period. Therefore, in this specific example, there is a delay equal to 6% of the pulse modulation period between the trailing edge of a BP pulse and the leading edge of an SP pulse. Since the pulse modulation period is 150 μs, this delay which is the trailing edge bias offset 9 is equal to 9 μs. Similar to the leading edge bias offset 6, the trailing edge bias offset 9 is not required to be positive, but may also be zero or negative.

The pulse amplitudes may be defined by corresponding high and low amplitude states. For example, the high and low amplitudes may be voltage levels. Specifically, each of the SP pulses 11 may oscillate between a SP low amplitude state 13 and an SP high amplitude state 14 while each of the BP pulses 12 may oscillate between a BP low amplitude state 17 and a BP high amplitude state 18. A positive or negative DC bias may be applied to one or both the source power 1 or the bias power 2 so that the respective high and low amplitudes are brought to desirable levels.

It should be mentioned that both the temperature curve 31 and density curve 32 are qualitative in nature. Therefore, while both may be indicative of important phenomena associated with the effect of a pulse sequence on plasma parameters such as $T_e$, $T_i$, and $n_e$, neither are intended to be drawn with a specific scale or be quantitatively accurate. Furthermore, simplifications may have been made for the sake of clarity. For example, the electron temperature $T_e$ and the ion temperature $T_i$ have been represented as a single curve in graph 102 because the shape of the curves is similar even though $T_e$ is at least an order of magnitude greater than $T_i$ in a cold plasma.

Figure 2:
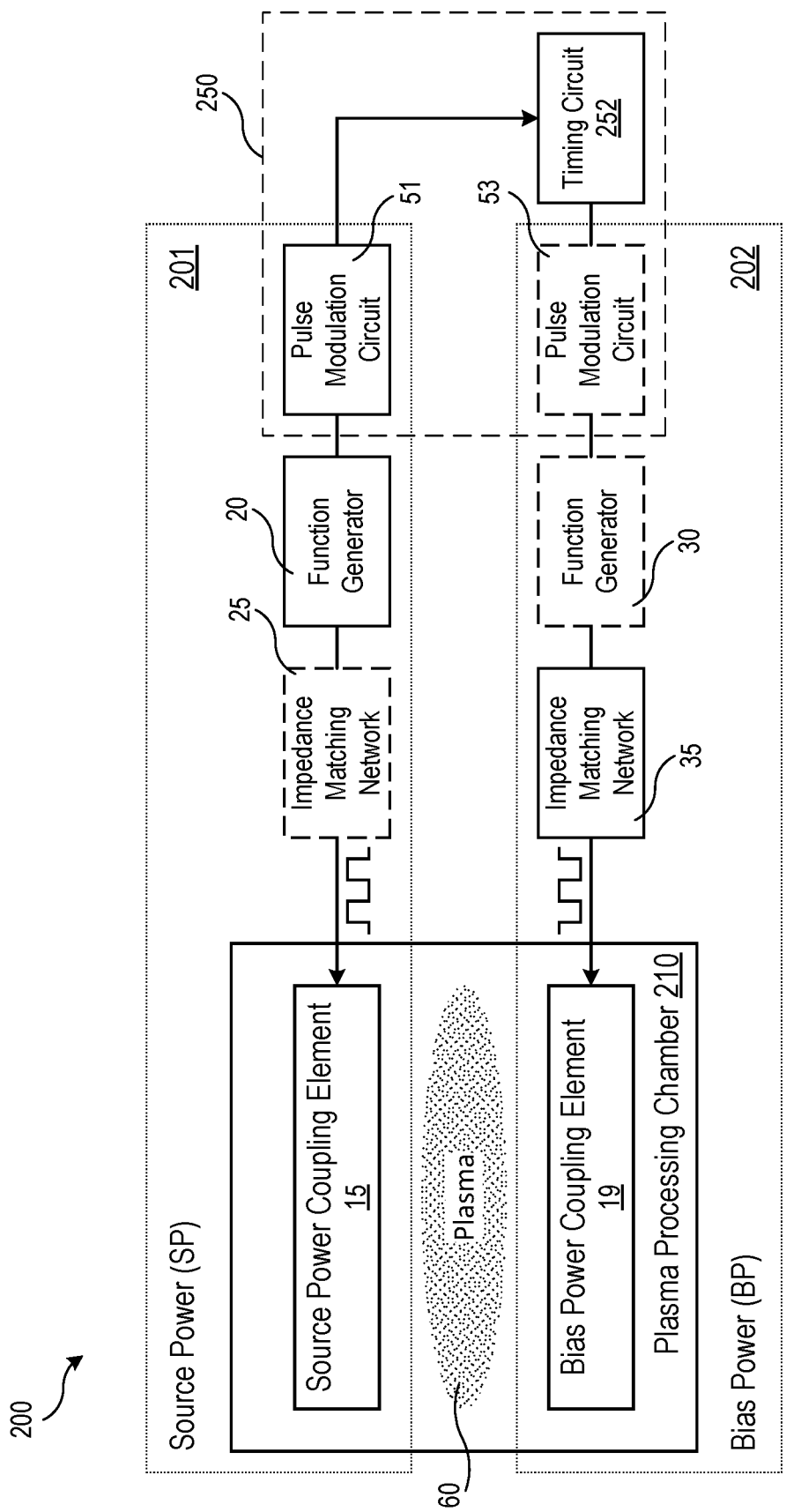
FIG. 2 illustrates a block diagram of an example plasma processing system including a source pulse modulation circuit and a pulse modulation timing circuit in accordance with an embodiment of the invention.

FIG. 2 illustrates a block diagram of an example plasma processing system including a source pulse modulation circuit and a pulse modulation timing circuit in accordance with an embodiment of the invention. The plasma processing system of FIG. 2 may be used to perform any of the embodiment methods as described herein, such as the method of FIG. 1, for example.

Referring to FIG. 2, a plasma processing system 200 includes an SP coupling element 15 coupled to a plasma processing chamber 210. The SP coupling element may allow application of source power to the plasma processing chamber 210 resulting in the generation of a plasma 60. In various embodiments, the SP coupling element 15 is a conductive coil positioned around the plasma processing chamber 210 and is a quarter-wave helical resonator in one embodiment. In another embodiment, the SP coupling element 15 is a half-wave helical resonator that may implemented as a planar spiral coil positioned above the plasma processing chamber 210. Alternatively, other SP coupling elements may be employed, such as an antenna, plate electrode, or a waveguide, as examples.

The plasma processing system 200 further includes a BP coupling element 19 coupled to the plasma processing chamber 205. The BP coupling element 19 may enable application of bias power to a microelectronic workpiece being processed. In various embodiments, the BP coupling element 19 is a substrate holder and is an electrostatic chuck in one embodiment.

The source power may be coupled to the plasma processing chamber 210 using an SP control path 201 which includes a SP pulse modulation circuit 51. The SP pulse modulation circuit 51 may modulate a source signal between an SP high amplitude state 14 and an SP low amplitude state 13. For example, the modulated source signal may correspond with the SP pulses 11 as described in reference to FIG. 1. The modulated source signal may be received by an SP function generator 20 which may superimpose a waveform onto the modulated source signal. The SP function generator 20 may also optionally include an amplification circuit configured to increase the amplitude of the modulated source signal.

The frequency of the superimposed waveform may be higher than the pulse modulation frequency. In various embodiments, the frequency of the superimposed waveform may be an RF frequency and is about 13.56 MHz in one embodiment. As a result, each of the resulting SP pulses may include several cycles of the superimposed waveform. The waveform shape may include a periodic waveform such as a sinusoidal wave, a square wave, a sawtooth wave, and the like. Alternatively, the waveform shape may include an aperiodic wave such as a superposition of multiple sinusoidal waves of various frequencies to generate an arbitrary waveform shape.

The SP control path 201 may include an optional SP impedance matching network 25. The SP pulses generated by the SP function generator 20 may pass through the optional SP impedance matching network 25 before being coupled to the plasma processing chamber 210 by the SP coupling element 15. The optional SP impedance matching network 25 may be omitted in certain plasma processing systems such as when the SP coupling element 15 is a resonant structure inductively coupled to the plasma 60. Conversely, the optional SP impedance matching network 25 may be included when the SP coupling element 15 is non-resonant. The optional SP impedance matching network 25 may be used to ensure that the source power is efficiently coupled to the plasma 60 by matching the impedance of the load to the impedance of the supply.

Still referring to FIG. 2, the bias power may be coupled to the plasma processing chamber 210 using a BP control path 202. The BP control path 202 may be coupled to the SP control path 201 through a pulse modulation timing circuit 252. The pulse modulation timing circuit 252 may determine the timing of BP pulses relative to the timing of SP pulses generated by the SP control path 201. The pulse modulation timing circuit 252 may receive a signal from the SP pulse modulation circuit 51 and introduce a delay triggered by either the leading edge or the trailing edge of an SP pulse. For example, if the leading edge bias offset parameter is set to 8% of the pulse modulation period, the pulse modulation timing circuit 252 may introduce a delay equal to 8% of the pulse modulation period after being triggered by the trailing edge of an SP pulse. Alternatively, if the pulse modulation timing circuit 252 is configured to be triggered by the leading edge of an SP pulse, a delay of 8% of the pulse modulation period plus the source power duty cycle (%) may be introduced by the pulse modulation timing circuit 252. Alternatively, the pulse modulation timing circuit 252 may determine the timing of SP pulses relative to the timing of BP pulses generated by the BP control path 202.

Similar to the SP control path 201, the BP control path 202 may include an optional BP pulse modulation circuit 53 triggered by the pulse modulation timing circuit 252. The optional BP pulse modulation circuit 53 may modulate a bias signal between a BP high amplitude state and a BP low amplitude state. For example, the modulated bias signal may correspond with the BP pulses 12 as described in reference to FIG. 1. Alternatively, the optional BP pulse modulation circuit 53 may be omitted and a delayed modulated source signal may correspond with the BP pulses.

The modulated bias signal may be received by an optional BP function generator 30. The optional BP function generator 30 may superimpose a waveform onto the modulated bias signal. The waveform may be similar or different than the waveform superimposed on the modulated source signal and may have any desired waveform shape as previously described. The optional BP function generator 30 may also optionally include an amplification circuit to increase the amplitude of the modulated bias signal. In one embodiment, the bias power delivered to the plasma processing chamber 210 is DC power. In this case, the optional BP function generator 30 may be omitted. In some cases where amplification is needed, but function generation is not, an amplification circuit may be included instead of the optional BP function generator 30.

A BP impedance matching network 35 is also included in the BP control path 202 between the optional BP function generator 30 and the BP coupling element 19. The BP impedance matching network may be used to ensure that the bias power is efficiently coupled to the plasma processing chamber 210 by matching the impedance of the load to the impedance of the supply.

One or more of the elements described above may be included in a controller. For example, as shown in FIG. 2, the SP pulse modulation circuit 51, pulse modulation timing circuit 252, and optional BP pulse modulation circuit 53 may be included in a controller 250. The controller 250 may be locally located relative to the plasma processing chamber 210. Alternatively, controller 250 may be located remotely relative to the plasma processing chamber 210. The controller 250 may be capable of exchanging data with one or more of the elements included in the SP control path 201 and the BP control path 202. Each of the impedance matching networks may be controlled by controller 250 or may include a separate controller.

The controller 250 may be configured to set, monitor, and/or control various control parameters associated with generating a plasma and delivering ions to the surface of a microelectronic workpiece. Control parameters may include, but are not limited to power level, frequency, and duty cycle (%) for both the source power and the bias power as well as bias offset percentage. Other control parameter sets may also be used. For example, pulse width of the SP pulses and BP pulses and the bias offset may be entered directly rather than being defined as a duty cycle (%) of the pulse modulation period.

Figure 3:
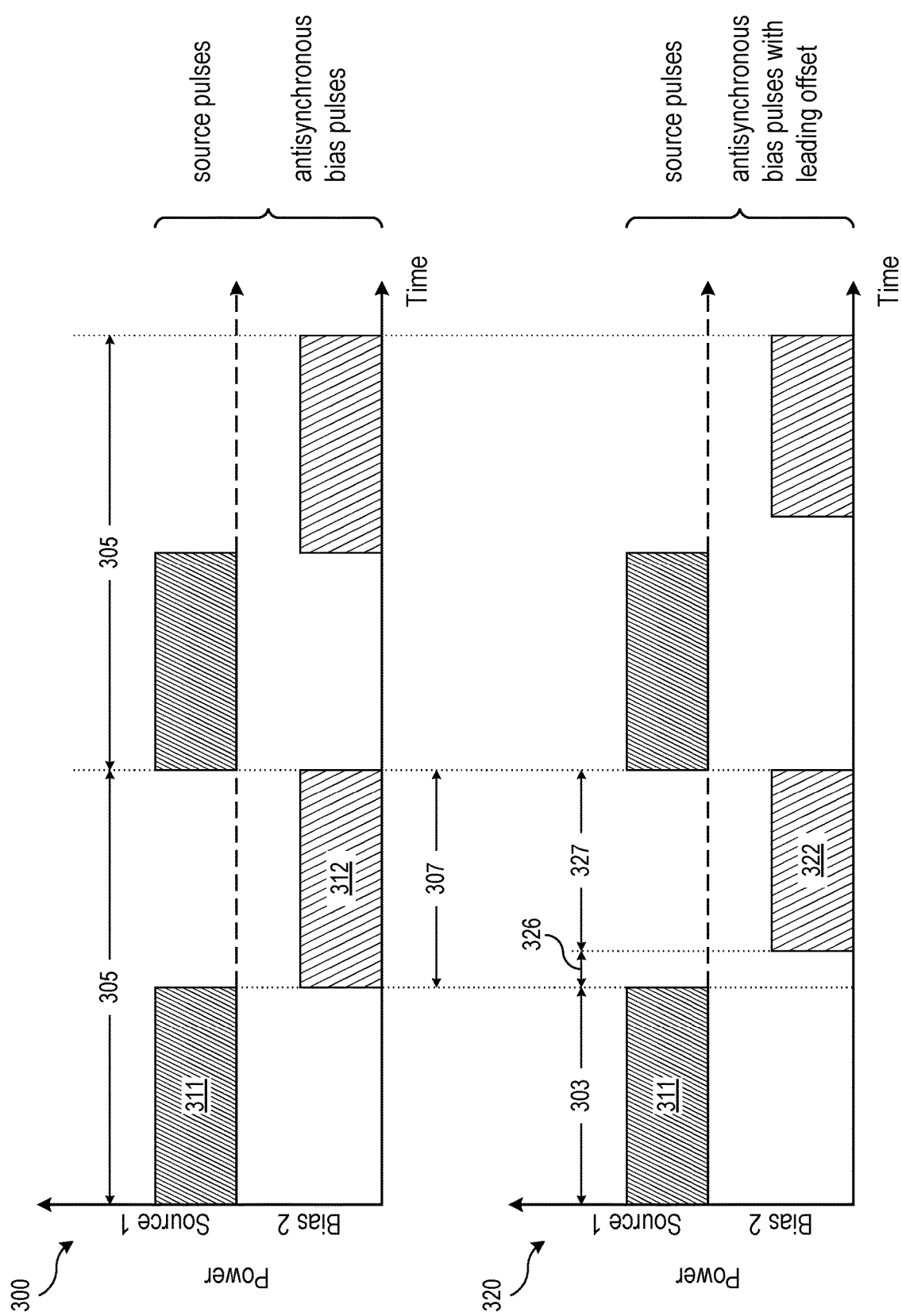
FIG. 3 illustrates schematic timing diagrams of example methods of control for plasma processing including antisynchronous bias power pulses in accordance with embodiments of the invention.

FIG. 3 illustrates schematic timing diagrams of example methods of control for plasma processing including antisynchronous bias power pulses in accordance with embodiments of the invention. The timing diagrams of FIG. 3 may be specific implementations of other embodiment timing diagrams, such as timing diagram 100 of FIG. 1, for example. Similarly labeled elements may be as previously described.

Referring to FIG. 3, a timing diagram 300 includes a source power 1 and a bias power 2 which are pulsed to generate and deliver ions to a microelectronic workpiece. Specifically, timing diagram 300 includes a periodic pulse sequence with a shared pulse modulation period 305 for a series of 50% SP pulses 311 and 50% BP pulse 312. Both the 50% SP pulses 311 and the 50% BP pulses 312 are pulsed for half of the shared pulse modulation period 305 which corresponds to a 100% duty cycle (%). That is, the 50% SP pulses 311 have a 50% SP pulse width 303 with a 50% duty cycle (%) and the 50% BP pulses 312 have a 50% BP pulse width 307 with a 50% duty cycle (%).

In one embodiment, the shared pulse modulation period 305 is about 200 µs. Accordingly, the 50% SP pulse width 303 is about 100 µs and the 50% BP pulse width 307 is about 100 µs in this embodiment. In other embodiments, the shared pulse modulation period 305 may be any desirable length. For example, the shared pulse modulation period 305 may be less than or greater than 200 µs. In various embodiments, the shared pulse modulation period 305 is on the order of microseconds (µs). In other embodiments, the shared pulse modulation period 305 may be on the order of milliseconds (ms) or seconds (s). In one embodiment, the shared pulse modulation period 305 is about 1 s.

Still referring to FIG. 3, a timing diagram 320 is similar to timing diagram 300 including source power 1 and bias power 2 which are pulsed with a shared pulse modulation period 305. However, in timing diagram 320, a nonzero leading edge bias offset 326 is included between the 50% SP pulses 311 and a <50% BP pulses 322. Since the off time of the 50% SP pulses 311 are equal to a 50% duty cycle (%), the <50% BP pulses 322 have a <50% BP pulse width 327 equal to a less than 50% duty cycle (%). Specifically, the <50% BP pulse width 327 is equal to a 50% duty cycle (%) minus the nonzero leading edge bias offset 326.

In one embodiment, the shared pulse modulation period 305 is about 200 µs, the nonzero leading edge bias offset 326 is about 20 µs and the <50% BP pulse width 327 is about 80 µs. Accordingly, the 50% SP pulse width 303 is about 100 µs in this embodiment. This corresponds to the nonzero leading edge bias offset 326 of about 10% duty cycle (%) and a <50% BP pulse width 327 of about 40% duty cycle (%). In other embodiments, the nonzero leading edge bias offset 326 may be any desirable length that is less than the shared pulse modulation period 305. For example, the nonzero leading edge bias offset 326 may be less than or greater than 20 is.

Since the 50% SP pulses 311 and the 50% BP pulses 312 are completely non-overlapping in time and share the shared pulse modulation period 305, the 50% SP pulses 311 and the 50% BP pulses 312 are antisynchronous. That is, 50% SP pulses 311 are out-of-phase with the 50% BP pulses 312 because the 50% SP pulses 311 are only at a high amplitude state when the 50% BP pulses 312 are at a low amplitude state. Furthermore, the 50% SP pulses 311 and the 50% BP pulses 312 are synchronized in the sense that they share the same modulation period. Such an out-of-phase synchronized relationship may be referred to as an antisynchronized relationship. Similarly, 50% SP pulses 311 and the <50% BP pulses 322 are also antisynchronous with one another.

Delivering antisynchronous BP pulses to the plasma processing chamber may beneficially increase the effectiveness of the BP pulses. For example, during the high amplitude state of an SP pulse, energy is being coupled to the plasma to generate ions. The thermal energy of the ions is increasing which may increase thermal motion. On average, the random thermal motion of the ions may introduce horizontal velocity components to the vertical velocity imparted by the bias power. In addition, during the high amplitude state of an SP pulse, current to a substrate being processed may be large which may decrease the voltage to the substrate when power is fixed. Therefore, applying bias power during the high amplitude state of an SP pulse may be less effective at generating vertical or near-vertical ions than applying a BP pulse during the low amplitude state of an SP pulse.

The nonzero leading edge bias offset 326 may be determined based on the cooling rate of the plasma in addition to other factors. For example, since the source power 1 is off during the delay between the SP pulse and the BP pulses, the generated plasma may lose power and the charged particle temperatures and densities may decrease. Therefore, the nonzero leading edge bias offset 326 may advantageously allow the ion temperature $T_i$ to be low in comparison to the sheath voltage $V_s$ induced by the following BP pulse.

Timing diagram 300 and timing diagram 320 are specific cases of timing diagram 100 as previously described. For example, timing diagram 300 corresponds with a scenario in which the SP pulse width 3 is equal to 50% duty cycle (%) and both the leading edge bias offset 6 and the trailing edge bias offset 9 are equal to zero. Similarly, timing diagram 320 corresponds with a scenario in which the SP pulse width 3 is equal to 50% duty cycle (%), the leading edge bias offset 6 is nonzero and positive, and the trailing edge bias offset 9 is equal to zero. By varying pulse modulation process parameters in view of the embodiments described herein, many other timing diagrams will be apparent to one of skill in the art. That is, different offsets, pulse widths, and pulse modulation periods may also be used while still taking advantage of the techniques as described herein.

Figure 4:
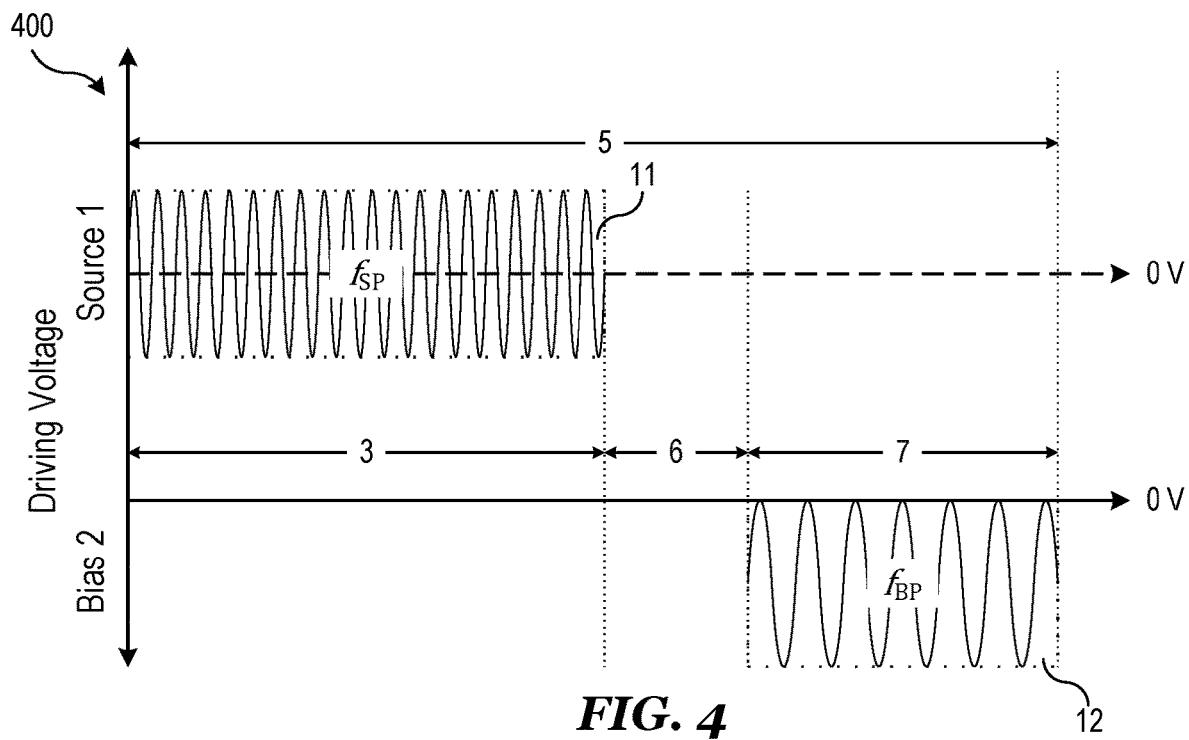
FIG. 4 illustrates a schematic timing diagram of an example method of control for plasma processing including a high frequency radio frequency (RF) source power pulse and a low frequency RF bias power pulse in accordance with an embodiment of the invention.

FIG. 4 illustrates a schematic timing diagram of an example method of control for plasma processing including a high frequency RF source power pulse and a low frequency RF bias power pulse in accordance with an embodiment of the invention. The timing diagrams of FIG. 4 may be specific implementations of other embodiment timing diagrams, such as timing diagram 100 of FIG. 1 or timing diagram 320 of FIG. 3, as examples. Similarly labeled elements may be as previously described.

Referring to FIG. 4, a timing diagram 400 includes a source power 1 and a bias power 2 which are pulsed to generate and deliver ions to a microelectronic workpiece. Specifically, timing diagram 400 includes a pulse modulation period 5 with one or more SP pulses 11 and one or more BP pulses 12 having SP pulse width 3, leading edge bias offset 6 and BP pulse width 7. Each of the SP pulses 11 includes a periodic waveform with an SP frequency $f_{SP}$ which may be superimposed on the SP pulses 11 by a function generator. In one embodiment, the periodic waveform may be a sinusoidal wave and the source power may be AC power. However, other waveforms are also possible as previously described. Each of the BP pulses 12 may also include a periodic waveform with a BP frequency $f_{BP}$, which may be similar or different from the periodic waveform of the SP pulses 11.

The inventors have discovered that in some instances, the application of high frequency pulses in the afterglow phase may result in undesirable electron heating and plasma generation (e.g., in halogen plasmas) which may potentially reduce and/or eliminate the effectiveness of the pulse sequences as described herein. This potential problem may be alleviated by applying low frequency AC power, DC power, or alternating polarity DC voltage during the afterglow phase. As previously described, the afterglow interval may begin when the source power is in a low amplitude state. Therefore, the BP pulses including low frequency AC power, DC power, or alternating polarity DC voltage may advantageously reduce or eliminate undesirable electron heating and plasma generation in the afterglow phase.

Accordingly, in various embodiments, $f_{BP}$ is less than $f_{SP}$. In one embodiment, $f_{BP}$ is less than 20 MHz. In another embodiment, $f_{BP}$ is less than 400 kHz. In one embodiment, $f_{SP}$ is about 13.56 MHz and hp is less than 400 kHz. SP frequency $f_{SP}$ any frequency such as RF, very high frequency (VHF), microwave (MW), and others. In one embodiment, $f_{SP}$ is greater than 10 MHz and $f_{BP}$ is less than 5 MHz. In another embodiment, $f_{SP}$ is greater than 50 MHz and hp is less than 5 MHz. In still another embodiment, $f_{SP}$ is between about 50 MHz and about 150 MHz while $f_{BP}$ is between about 1 MHz and about 5 MHz.

Figure 5:
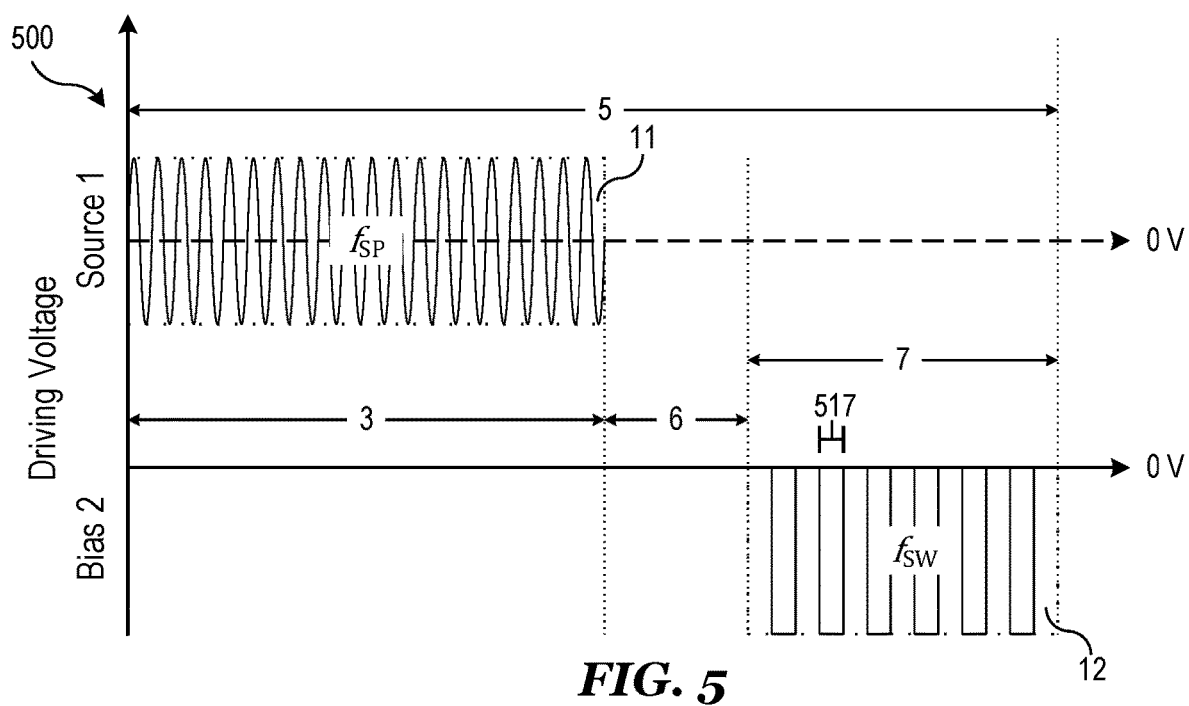
FIG. 5 illustrates a schematic timing diagram of an example method of control for plasma processing including a high frequency RF source power pulse and a low frequency square wave bias power pulse in accordance with an embodiment of the invention.

FIG. 5 illustrates a schematic timing diagram of an example method of control for plasma processing including a high frequency RF source power pulse and a low frequency square wave bias power pulse in accordance with an embodiment of the invention. The timing diagrams of FIG. 5 may be specific implementations of other embodiment timing diagrams, such as timing diagram 100 of FIG. 1 or timing diagram 320 of FIG. 3, as examples. Similarly labeled elements may be as previously described.

Referring to FIG. 5, a timing diagram 500 includes a source power 1 and a bias power 2 which are pulsed to generate and deliver ions to a microelectronic workpiece. Specifically, timing diagram 400 includes a pulse modulation period 5 with one or more SP pulses 11 and one or more BP pulses 12 having SP pulse width 3, leading edge bias offset 6 and BP pulse width 7. Timing diagram 500 is similar to timing diagram 400 of FIG. 4 except that each of the BP pulses 12 include a periodic square wave with a square wave frequency $f_{SW}$ and a square wave pulse width 517. The square wave frequency $f_{SW}$ may be less than $f_{SP}$ and may be similar in magnitude to the BP frequency $1_{BP}$ of timing diagram 400 as previously described. In various embodiments, the periodic square wave may be generated from a superposition of harmonic sinusoidal waveforms by a function generator.

Figure 6:
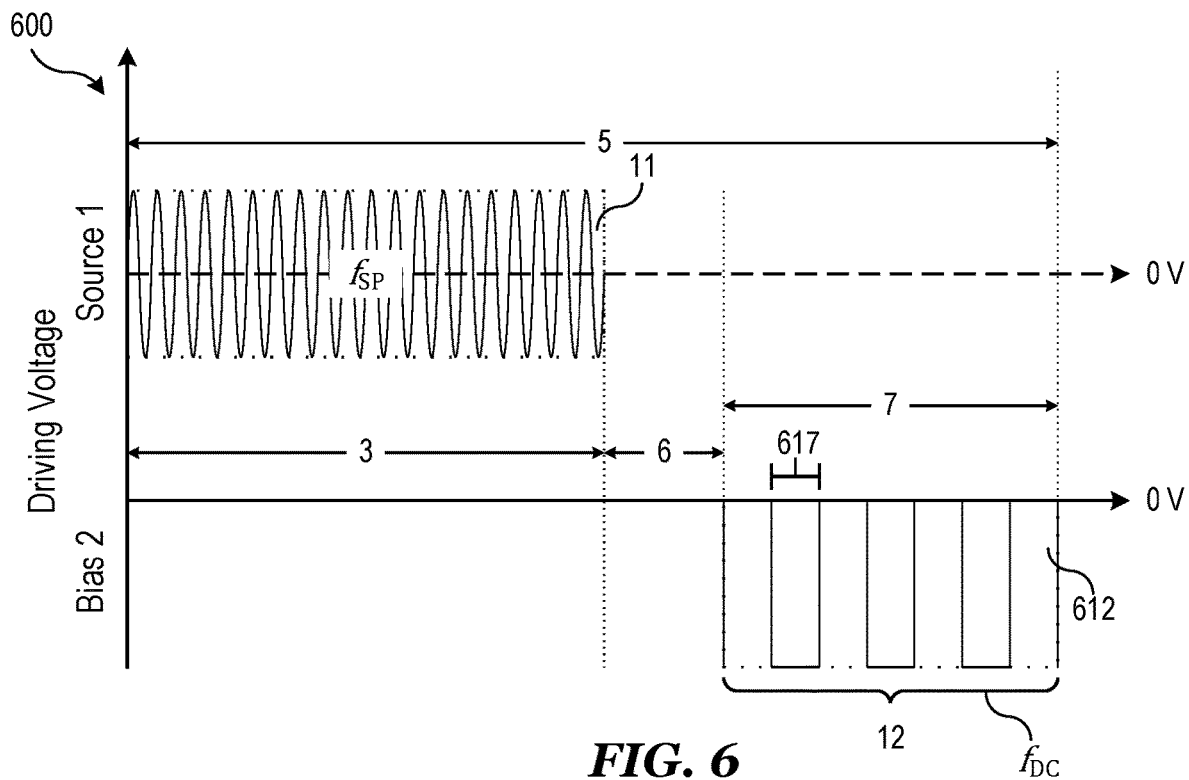
FIG. 6 illustrates a schematic timing diagram of an example method of control for plasma processing including a high frequency RF source power pulse and a pulsed DC bias power pulse in accordance with an embodiment of the invention.

FIG. 6 illustrates a schematic timing diagram of an example method of control for plasma processing including a high frequency RF source power pulse and a pulsed DC bias power pulse in accordance with an embodiment of the invention. The timing diagrams of FIG. 6 may be specific implementations of other embodiment timing diagrams, such as timing diagram 100 of FIG. 1 or timing diagram 320 of FIG. 3, as examples. Similarly labeled elements may be as previously described.

Referring to FIG. 6, a timing diagram 600 includes a source power 1 and a bias power 2 which are pulsed to generate and deliver ions to a microelectronic workpiece. Specifically, timing diagram 400 includes a pulse modulation period 5 with one or more SP pulses 11 and one or more BP pulses 12 having SP pulse width 3, leading edge bias offset 6 and BP pulse width 7. Timing diagram 600 is similar to timing diagram 400 of FIG. 4 except that each of the BP pulses 12 includes one or more DC pulses 612 with a DC frequency $f_{DC}$ and a DC pulse width 617. The DC frequency $f_{DC}$ is similar to the square wave frequency $f_{DC}$ except that each the DC pulses 612 may be generated by turning a DC voltage off and on. The DC frequency $f_{DC}$ may be less than $f_{SP}$ and may be similar in magnitude to the BP frequency $1_{BP}$ of timing diagram 400 as previously described.

The SP pulses 11 may include AC power for plasma generation while a microelectronic workpiece (e.g., a wafer) being processed may be pulsed with BP pulses 12 that include a DC voltage. The number of DC pulses 612 included in each of the BP pulses 12 may be relatively small. Consequently, in various embodiments, the DC frequency $f_{DC}$ is much smaller than the SP frequency $f_{SP}$. For example, in one embodiment, each of the BP pulses 12 may include only one continuous DC pulse 612. Alternatively, less than five DC pulses 612 may be included in each of the BP pulses 12. However, any suitable number of DC pulses 612 may be included in each of the BP pulses 12.

Figure 7:
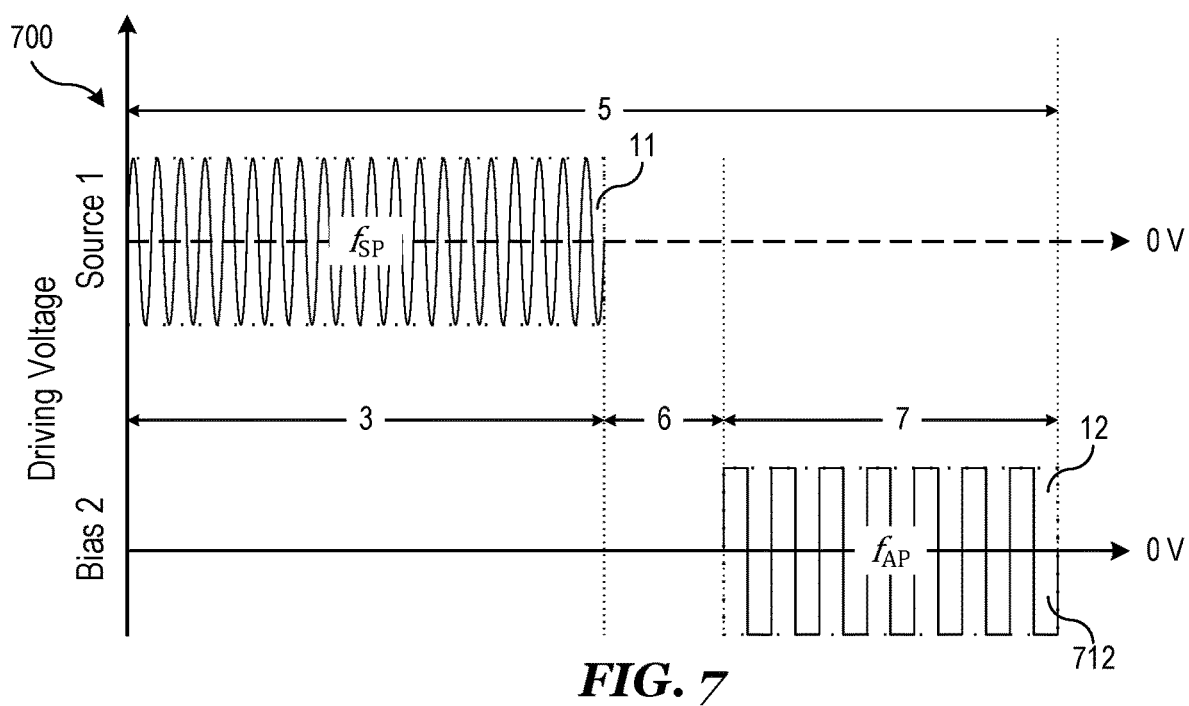
FIG. 7 illustrates a schematic timing diagram of an example method of control for plasma processing including a high frequency RF source power pulse and an alternating polarity pulsed DC bias power pulse in accordance with an embodiment of the invention.

FIG. 7 illustrates a schematic timing diagram of an example method of control for plasma processing including a high frequency RF source power pulse and an alternating polarity pulsed DC bias power pulse in accordance with an embodiment of the invention. The timing diagrams of FIG. 7 may be specific implementations of other embodiment timing diagrams, such as timing diagram 100 of FIG. 1 or timing diagram 320 of FIG. 3, as examples. Similarly labeled elements may be as previously described.

Referring to FIG. 7, a timing diagram 700 includes a source power 1 and a bias power 2 which are pulsed to generate and deliver ions to a microelectronic workpiece. Specifically, timing diagram 400 includes a pulse modulation period 5 with one or more SP pulses 11 and one or more BP pulses 12 having SP pulse width 3, leading edge bias offset 6 and BP pulse width 7. Timing diagram 700 is similar to timing diagram 600 of FIG. 6 except that each of the BP pulses 12 includes alternating polarity (AP) DC pulses 712 with an AP frequency $f_{AP}$. The AP DC pulses 712 are similar to the DC pulses 612 of FIG. 6 except that the AP DC pulses 712 are configured to alternate between a positive voltage level and a negative voltage level relative to a reference potential.

Alternating polarity DC voltage is useful, for example, when the substrate being processed includes dielectric layers that may charge up, which may result in undesirable arcing. In some embodiments, the width and height of the positive AP DC pulses 712 may be different from the width and the height of the negative AP DC pulses 712. For example, a positive DC pulse may attract ions to the surface of the workpiece. However, the following negative DC pulse may repel ions away from the surface. Therefore, it may be advantageous to implement longer positive DC pulses and larger negative DC pulses. In one embodiment, the width of the positive DC pulses is greater than the width of the negative DC pulses.

In one embodiment, the height of the positive DC pulses is less than the height of the negative DC pulses. In one embodiment, the width of the positive DC pulses is greater than the width of the negative DC pulses and the height of the positive DC pulses is less than the height of the negative DC pulses. In other embodiments, the heights and or the widths of the positive and negative DC pulses may be the same. In various embodiments, each of the BP pulses 12 includes a single positive AP DC pulse and a single negative AP DC pulse. In one embodiment, the single positive AP DC pulse occurs while the source power is off (i.e., low amplitude state) and the single negative AP DC pulse occurs while the source power is on (i.e., overlapping in time with the high amplitude state of the following SP pulse).

Figure 8:
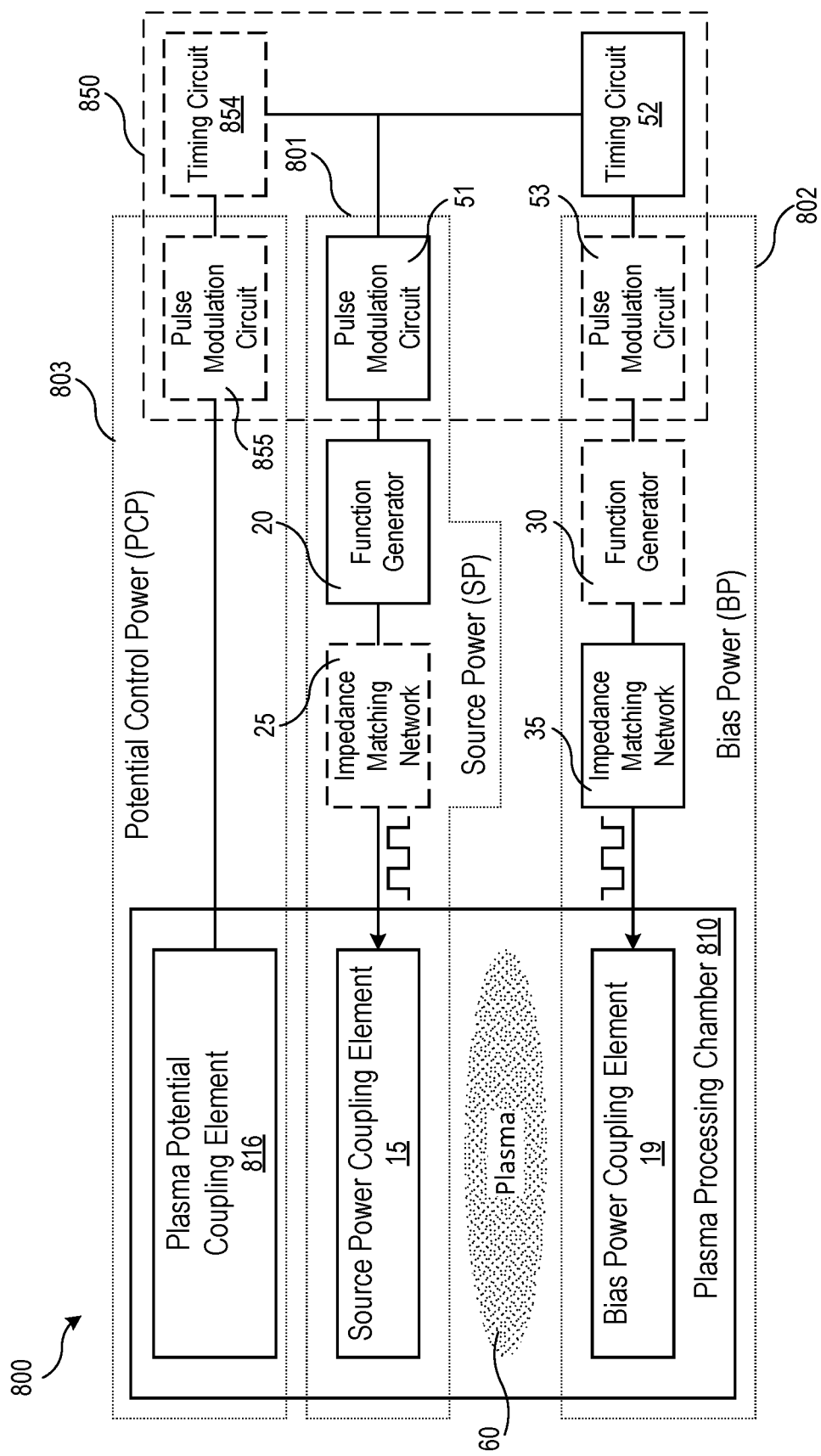
FIG. 8 illustrates a block diagram of an example plasma processing system including a plasma potential coupling element in addition to a source pulse modulation circuit and a pulse modulation timing circuit in accordance with an embodiment of the invention.

FIG. 8 illustrates a block diagram of an example plasma processing system including a plasma potential coupling element in addition to a source pulse modulation circuit and a pulse modulation timing circuit in accordance with an embodiment of the invention. The plasma processing system of FIG. 8 may be a specific implementation of other embodiment plasma processing systems, such as plasma processing system 200 of FIG. 2, for example. The plasma processing system of FIG. 8 may be used to perform any of the embodiment methods as described herein, such as the method of FIG. 9, for example. Similarly labeled elements may be as previously described.

Referring to FIG. 8, a plasma processing system 800 includes a BP control path 802 coupled to an SP control path 801 using a BP timing circuit 52 which provides source power and bias power to a plasma processing chamber 810. The SP control path 801 and the BP control path 802 may be similar to the SP control path 201 and the BP control path 202 of FIG. 2. In addition, plasma processing system 800 also includes a potential control power (PCP) control path 803. The PCP control path 803 couples power to a plasma 60 using a plasma potential coupling element 816. In one embodiment, the plasma potential coupling element 816 is a plate electrode. However, any of the previously described coupling elements may be used.

The PCP control path 803 may be coupled to the SP control path 801 through an optional PCP timing circuit 854. The optional PCP timing circuit 854 may be coupled to an SP pulse modulation circuit 51 and/or the BP timing circuit 52. Similar to the BP timing circuit 52, the optional PCP timing circuit 854 may control the timing of the application of potential control power to the plasma processing chamber 810 relative to SP pulses and/or BP pulses delivered by the SP control path 801 and the BP control path 802. The PCP control path 803 may provide PCP pulses to the plasma potential coupling element 816 through an optional PCP pulse modulation circuit 855.

In various embodiments, one or more of the SP pulse modulation circuit 51, the BP timing circuit 52, an optional BP pulse modulation circuit 53, the optional PCP timing circuit 854, and the optional PCP pulse modulation circuit 855 may be included in a controller 850. As with previously described controllers, controller 850 may be positioned locally or remotely relative to the plasma processing chamber 810.

The power coupled to the plasma using the plasma potential coupling element 816 may advantageously lower the potential of the plasma during the high amplitude state of an SP pulse. In one embodiment, negative DC ($-V_{PCP}$) pulses are provided during the SP pulses. In this case, the $-V_{PCP}$ pulses may lower the bulk potential of the plasma 60. For example, a negative potential at the plasma potential coupling element 816 may repel electrons from the plasma sheath into the plasma bulk. This negative charge injection may lower the bulk potential which may then lower the plasma temperature (e.g., $T_e$ and $T_i$). Therefore, the application of a negative DC potential to the plasma during plasma generation intervals may advantageously allow plasma generation with a decreased plasma temperature gain when compared to plasma generation with only the applied source power.

The power coupled to the plasma using the plasma potential coupling element 816 may provide an additional benefit of increasing the ion velocity to the surface of a microelectronic workpiece during the BP pulses. In one embodiment, positive DC ($+V_{PCP}$) pulses are provided during the BP pulses. The $+V_1$ pulses may repel ions toward the workpiece thereby increasing the vertical velocity of the ions relative to the workpiece surface. Therefore the application of a positive DC potential to the plasma during high amplitude states of the BP pulses may advantageously increase the verticality of the ions as well as the ion energy to the workpiece surface. It should be noted that while the $-V_{PCP}$ and $+V_{PCP}$ pulses may be utilized in the same pulse sequence, either or both may be omitted in some embodiments.

Figure 9:
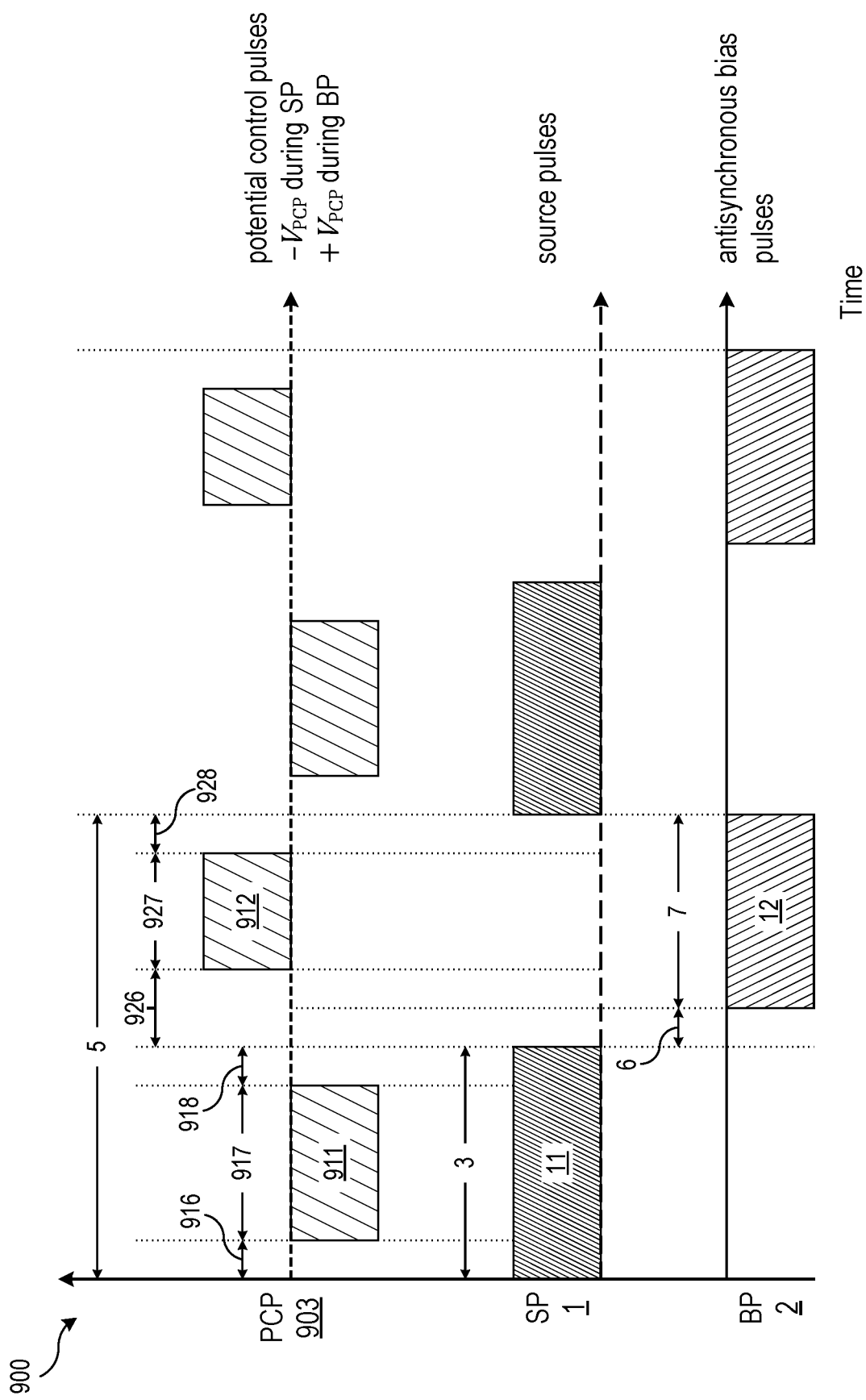
FIG. 9 illustrates a schematic timing diagram of an example method of control for plasma processing including potential control power pulses in addition to source power pulses and bias power pulses in accordance with an embodiment of the invention.

FIG. 9 illustrates a schematic timing diagram of an example method of control for plasma processing including potential control power pulses in addition to source power pulses and bias power pulses in accordance with an embodiment of the invention. The timing diagrams of FIG. 9 may be specific implementations of other embodiment timing diagrams, such as timing diagram 100 of FIG. 1, for example. Similarly labeled elements may be as previously described.

Referring to FIG. 9, a timing diagram 900 includes a source power 1, a bias power 2, and a potential control power 903 which are pulsed to generate and deliver ions to a microelectronic workpiece. Timing diagram 900 includes an additional pulse sequence including $-V_{PCP}$ pulses 911 and $+V_{PCP}$ pulses 912. As with BP pulses 12, the $-V_{PCP}$ pulses 911 and the $+V_{PCP}$ pulses 912 are delayed with respect to the SP pulses 11 using various offset parameters. For example, the $-V_{PCP}$ pulses 911 include a leading edge −PCP offset 916, a $-V_{PCP}$ pulse width 917, and a trailing edge 31 PCP offset 918 which allow control over the timing and duration of the $-V_{PCP}$ pulses 911. Similarly, the $+V_{PCP}$ pulses 912 include a leading edge +PCP offset 926, a $+V_{PCP}$ pulse width 927, and a trailing edge +PCP offset 928 which allow control over the timing and duration of the $+V_{PCP}$ pulses 912.

As with previously described pulses, the $-V_{PCP}$ pulses 911 and the $+V_{PCP}$ pulses 912 may include any suitable pulse widths and offsets as necessary to exercise desired control over a generated plasma during plasma processing of a workpiece surface. However, the $-V_{PCP}$ pulses 911 and the $+V_{PCP}$ pulses 912 must be non-overlapping in time. Pulse height of both of the $-V_{PCP}$ pulses 911 and the $+V_{PCP}$ pulses 912 may also be controlled. In one embodiment, the magnitude of the pulse heights of the $-V_1$ pulses 911 and the $+V_1$ pulses 912 are substantially equal. However, in other embodiments, the magnitude of the pulse heights of the $-V_{PCP}$ pulses 911 and the $+V_{PCP}$ pulses 912 may be different.

Figure 10:
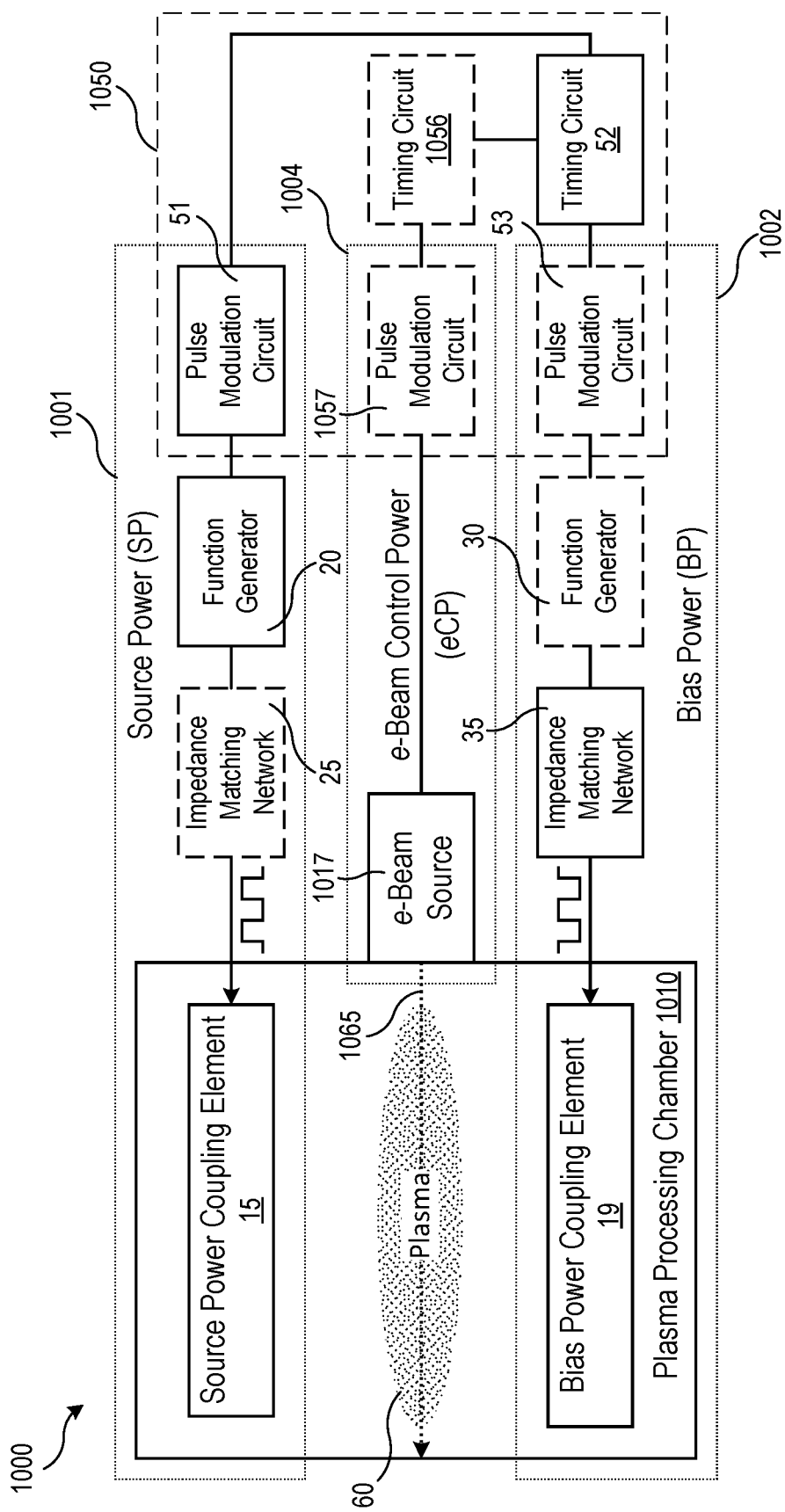
FIG. 10 illustrates a block diagram of an example plasma processing system including an electron beam source in addition to a source pulse modulation circuit and a pulse modulation timing circuit in accordance with an embodiment of the invention.

FIG. 10 illustrates a block diagram of an example plasma processing system including an electron beam source in addition to a source pulse modulation circuit and a pulse modulation timing circuit in accordance with an embodiment of the invention. The plasma processing system of FIG. 10 may be a specific implementation of other embodiment plasma processing systems, such as plasma processing system 200 of FIG. 2, for example. The plasma processing system of FIG. 10 may be used to perform any of the embodiment methods as described herein, such as the method of FIG. 11, for example. Similarly labeled elements may be as previously described.

Referring to FIG. 10, a plasma processing system 1000 includes a BP control path 1002 coupled to an SP control path 1001 using a BP timing circuit 52 which provides source power and bias power to a plasma processing chamber 1010. The SP control path 1001 and BP control path 1002 may be similar to the SP control path 201 and the BP control path 202 of FIG. 2. In addition, plasma processing system 1000 also includes an electron beam (e-beam) control power (eCP) control path 1004. The eCP control path 1004 generates electrons 1065 and introduces them into plasma processing chamber 1010 at or near a plasma 60 using an e-beam source 1017. In various embodiments, the e-beam source 1017 generates a directional stream of electrons. In one embodiment, the directional stream of electrons generated by the e-beam source 1017 is directed toward the plasma 60, for example, inwards in a direction perpendicular to the ion flux direction.

The eCP control path 1004 may be coupled to the SP control path 1001 through an optional eCP timing circuit 1056. The optional eCP timing circuit 1056 may be coupled to an SP pulse modulation circuit 51 and/or the BP timing circuit 52. Similar to the BP timing circuit 52, the optional eCP timing circuit 1056 may control the timing e-beam control power relative to SP pulses and/or BP pulses delivered by the SP control path 1001 and the BP control path 1002. The eCP control path 1004 may alternate the e-beam source 1017 between an on-state and an off-state through an optional eCP pulse modulation circuit 1057 using a signal received from optional eCP timing circuit 1056.

In various embodiments, one or more of the SP pulse modulation circuit 51, the BP timing circuit 52, an optional BP pulse modulation circuit 53, the optional eCP timing circuit 1056, and the optional eCP pulse modulation circuit 1057 may be included in a controller 1050. As with previously described controllers, controller 1050 may be positioned locally or remotely relative to the plasma processing chamber 1010.

Similar to the $-V_{PCP}$ pulses 911 described above in reference to FIG. 8 and FIG. 9, the negative charge injected into the plasma 60 by the electrons 1065 may advantageously decrease the bulk potential and the temperature of the plasma 60. Since electrons 1065 are provided to the plasma 60 in the plasma processing chamber 1010 directly, the eCP control path 1004 may advantageously enable enhanced control of over $T_e$ and $T_i$ over other methods. The electrons 1065 may be provided during the SP pulses and/or the BP pulses. In one embodiment, the electrons 1065 are provided during the SP pulses. In various embodiments, the electrons 1065 may be provided between the SP pulses and the BP pulses. Alternatively, the electrons 1065 may be pulsed such that they overlap with only a small region of the trailing end of the SP pulses and do not overlap with the BP pulses.

Figure 11:
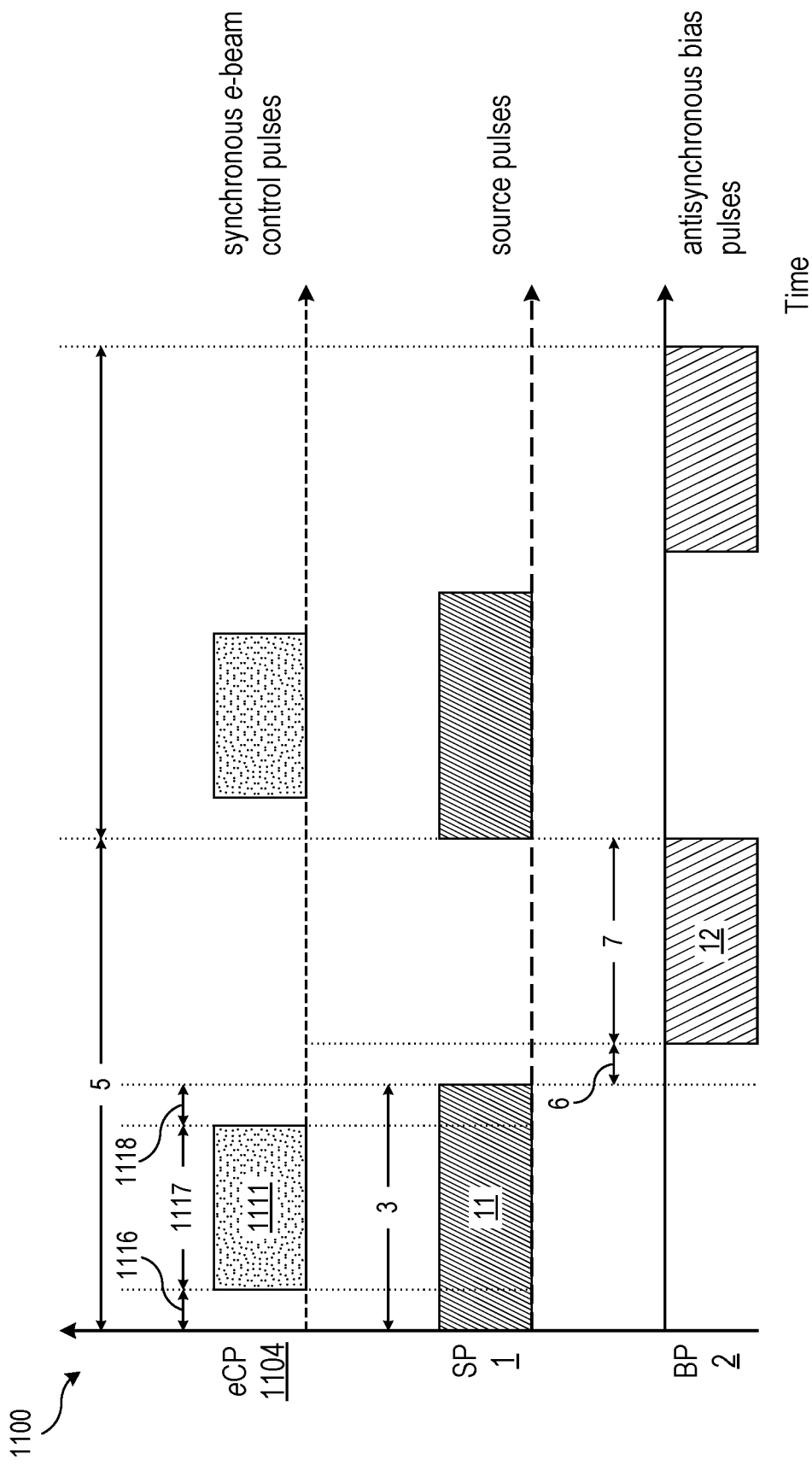
FIG. 11 illustrates a schematic timing diagram of an example method of control for plasma processing including electron beam power pulses in addition to source power pulses and bias power pulses in accordance with an embodiment of the invention.

FIG. 11 illustrates a schematic timing diagram of an example method of control for plasma processing including electron beam power pulses in addition to source power pulses and bias power pulses in accordance with an embodiment of the invention. The timing diagrams of FIG. 11 may be specific implementations of other embodiment timing diagrams, such as timing diagram 100 of FIG. 1, for example. Similarly labeled elements may be as previously described.

Referring to FIG. 11, a timing diagram 1100 includes a source power 1, a bias power 2, and an e-beam control power 1104 which are pulsed to generate and deliver ions to a microelectronic workpiece. Timing diagram 1100 includes an additional pulse sequence including eCP pulses 1111. As with BP pulses 12, the eCP pulses 1111 are delayed with respect to the SP pulses 11 using various offset parameters. For example, the eCP pulses 1111 include a leading edge eCP offset 1116, a eCP pulse width 1117, and a trailing edge eCP offset 1118 which allow control over the timing and duration of the eCP pulses 1111. As with previously described pulses, the eCP pulses 1111 may include any suitable pulse widths and offsets as necessary to exercise desired control over the generated plasma during plasma processing of a workpiece surface. Although timing diagram 1100 shows synchronous eCP pulses 1111, antisynchronous eCP pulses may also be applied instead of or in addition to the synchronous pulses.

Figure 12:
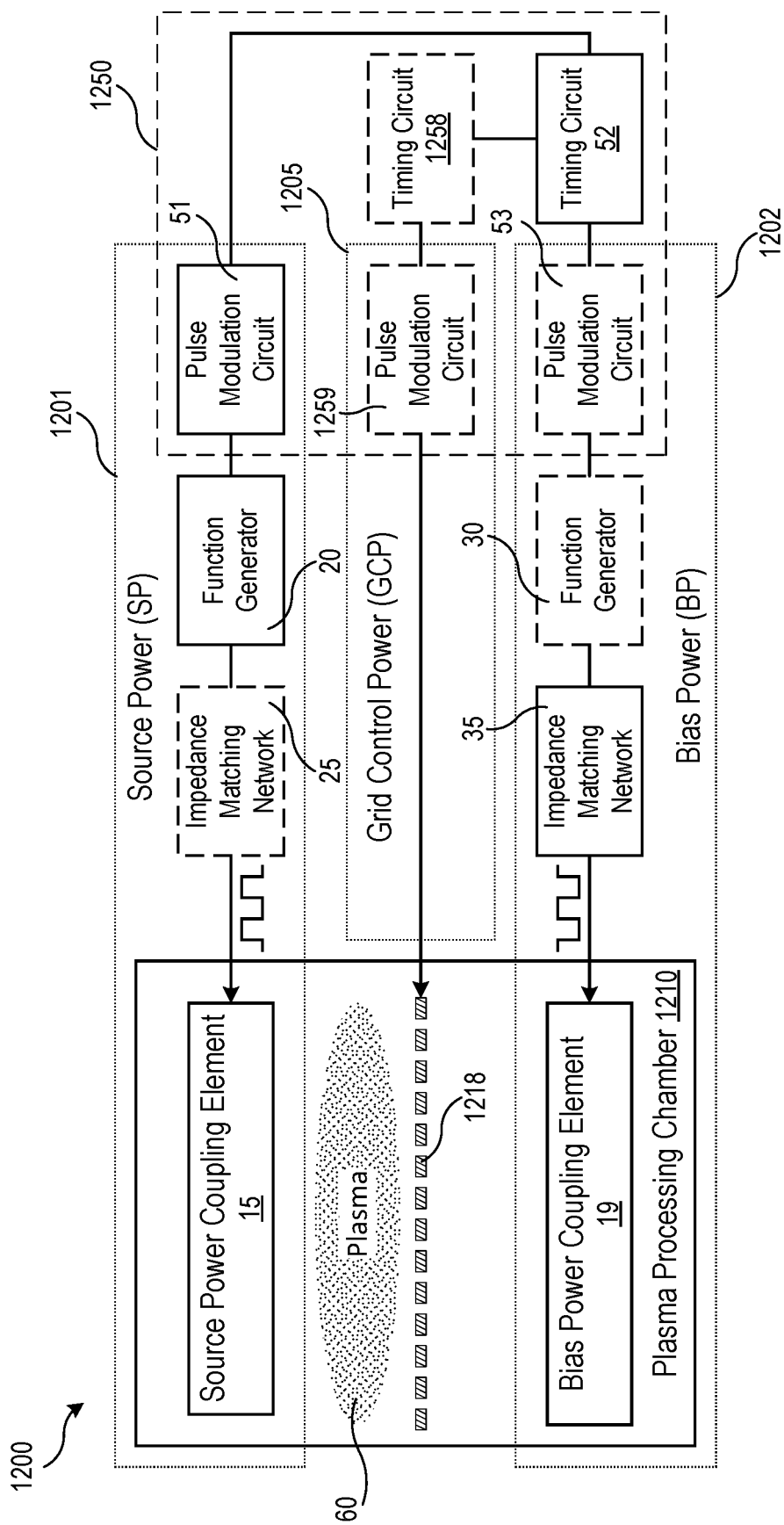
FIG. 12 illustrates a block diagram of an example plasma processing system including an electrically conductive grid in addition to a source pulse modulation circuit and a pulse modulation timing circuit in accordance with an embodiment of the invention.

FIG. 12 illustrates a block diagram of an example plasma processing system including an electrically conductive grid in addition to a source pulse modulation circuit and a pulse modulation timing circuit in accordance with an embodiment of the invention. The plasma processing system of FIG. 12 may be a specific implementation of other embodiment plasma processing systems, such as plasma processing system 200 of FIG. 2, for example. The plasma processing system of FIG. 12 may be used to perform any of the embodiment methods as described herein, such as the method of FIG. 13, for example. Similarly labeled elements may be as previously described.

Referring to FIG. 12, a plasma processing system 1200 includes a BP control path 1202 coupled to an SP control path 1201 using a BP timing circuit 52 which provides source power and bias power to a plasma processing chamber 1210. The SP control path 1201 and the BP control path 1202 may be similar to the SP control path 201 and the BP control path 202 of FIG. 2. In addition, plasma processing system 1200 also includes a grid control power (GCP) control path 1205. The GCP control path 1205 provides power to the plasma 60 using an electrically conductive grid 1218.

In one embodiment, the electrically conductive grid 1218 is a network of electrically conductive plates with a major dimension substantially perpendicular to a workpiece surface to be processed. In one embodiment, the electrically conductive grid 1218 is configured to increase the verticality of the ions delivered to the workpiece surface. In some embodiments, the electrically conductive grid may be an orifice plate, a charged particle filter, or a conduit. In some embodiments, the electrically conductive grid 1218 is configured to filter out charged particles of a remote plasma.

The GCP control path 1205 may be coupled to the SP control path 1201 through an optional GCP timing circuit 1258. The optional GCP timing circuit 1258 may be coupled to an SP pulse modulation circuit 51 and/or the BP timing circuit 52. Similar to the BP timing circuit 52, the optional GCP timing circuit 1258 may control the timing of the application of grid control power to the plasma processing chamber 1210 relative to SP pulses and/or BP pulses delivered by the SP control path 1201 and the BP control path 1202. The GCP control path 1205 may provide GCP pulses to the electrically conductive grid 1218 through an optional GCP pulse modulation circuit 1259

In various embodiments, one or more of the SP pulse modulation circuit 51, the BP timing circuit 52, an optional BP pulse modulation circuit 53, the optional GCP timing circuit 1258, and the optional GCP pulse modulation circuit 1259 may be included in a controller 1250. As with previously described controllers, controller 1250 may be positioned locally or remotely relative to the plasma processing chamber 1210.

Similar to the $-V_{PCP}$ pulses 911 described above in reference to FIG. 8 and FIG. 9, a negative potential in proximity to the plasma 60 may advantageously decrease the bulk potential and the temperature of the plasma 60. In contrast to the plasma potential coupling element 816 of FIG. 8, the electrically conductive grid 1218 may be positioned between the plasma 60 and the workpiece surface. Therefore, any potential applied to the electrically conductive grid 1218 during a BP pulse may be kept small in comparison to the potential of the BP coupling element 19 so that the dominant force on the ions is toward the workpiece surface.

Figure 13:
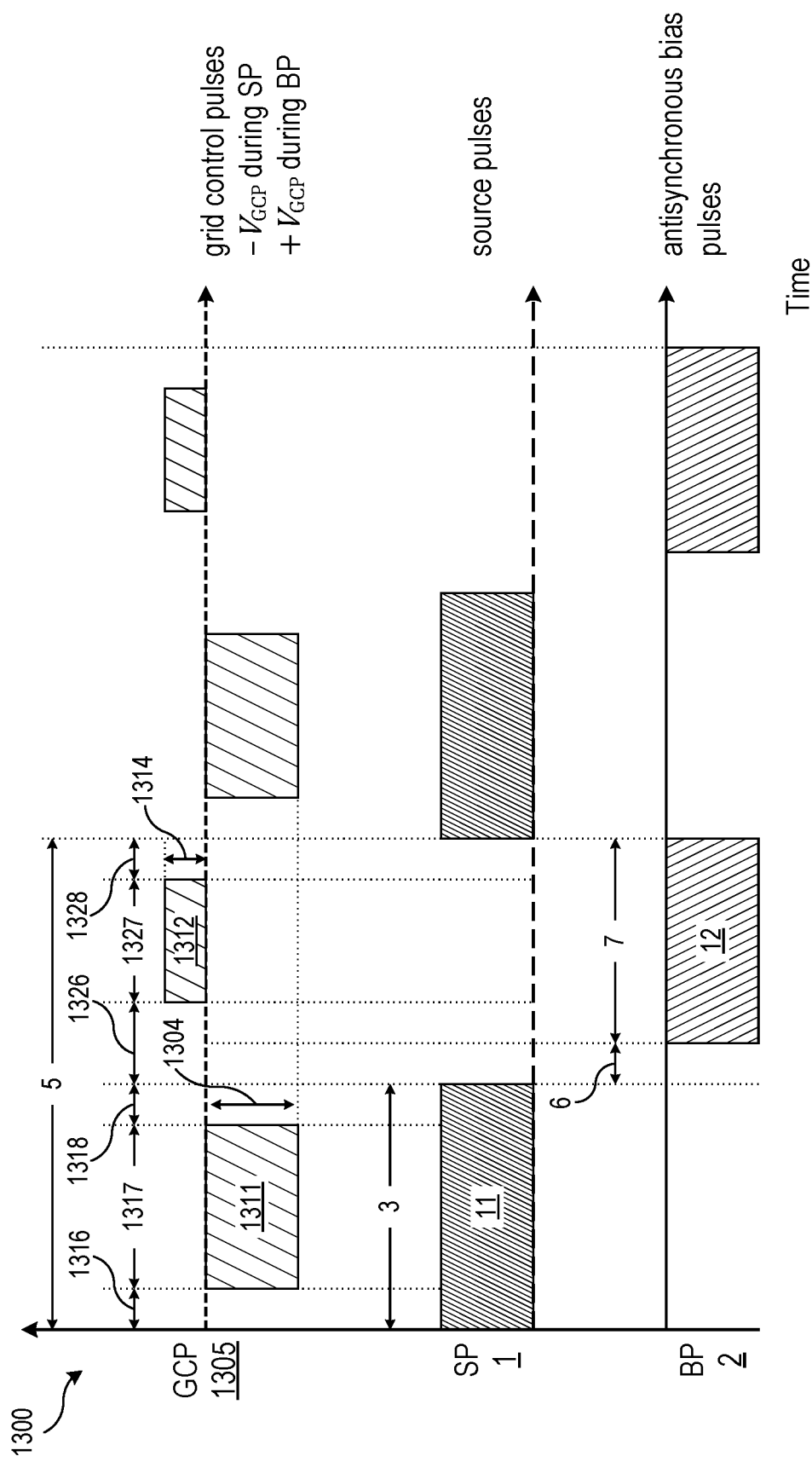
FIG. 13 illustrates a schematic timing diagram of an example method of control for plasma processing including grid control pulses in addition to source power pulses and bias power pulses in accordance with an embodiment of the invention.

FIG. 13 illustrates a schematic timing diagram of an example method of control for plasma processing including grid control pulses in addition to source power pulses and bias power pulses in accordance with an embodiment of the invention. The timing diagrams of FIG. 13 may be specific implementations of other embodiment timing diagrams, such as timing diagram 100 of FIG. 1, for example. Similarly labeled elements may be as previously described.

Referring to FIG. 13, a timing diagram 1300 includes a source power 1, a bias power 2, and a grid control power 1305 which are pulsed to generate and deliver ions to a microelectronic workpiece. Timing diagram 1300 includes an additional pulse sequence including SP GCP pulses 1311 and BP GCP pulses 1312. As with BP pulses 12, the SP GCP pulses 1311 and the BP GCP pulses 1312 are delayed with respect to the SP pulses 11 using various offset parameters. For example, the SP GCP pulses 1311 include a leading edge SP GCP offset 1316, an SP GCP pulse width 1317, and a trailing edge SP GCP offset 1318 which allow control over the timing and duration of the SP GCP pulses 1311. Similarly, the BP GCP pulses 1312 include a leading edge BP GCP offset 1326, a BP GCP pulse width 1327, and a trailing edge BP GCP offset 1328 which allow control over the timing and duration of the BP GCP pulses 1312.

The SP GCP pulses 1311 include an SP GCP pulse amplitude 1304 while the BP GCP pulses 1312 include a BP GCP pulse amplitude 1314. The SP GCP pulse amplitude 1304 and the BP GCP pulse amplitude 1314 may be positive or negative relative to a reference potential. In one embodiment, the SP GCP pulse amplitude 1304 and the BP GCP pulse amplitude 1314 are both negative. Alternatively, the SP GCP pulse amplitude 1304 is negative and the BP GCP pulse amplitude 1314 is positive.

It may be advantageous for the SP GCP pulse amplitude 1304 to be greater in magnitude than the BP GCP pulse amplitude 1314. For example, during an SP pulse, an SP GCP pulse may be used to decrease the bulk potential of the plasma. Therefore, the SP GCP pulse amplitude 1304 may be made sufficiently large so as to affect the bulk of the plasma. In contrast, during a BP pulse, a BP GCP pulse may be used to make small adjustments to the velocity of ions passing through an electrically conductive grid toward the vertical with respect to a workpiece surface. Therefore, the BP GCP pulse amplitude 1314 may be made sufficiently small so as to not reflect the ions back toward the plasma. In one embodiment, the SP GCP pulse amplitude 1304 is larger in magnitude than the BP GCP pulse amplitude 1314 and opposite in sign.

As with previously described pulses, the SP GCP pulses 1311 and the BP GCP pulses 1312 may include any suitable pulse widths and offsets as necessary to exercise desired control over a generated plasma during plasma processing of a workpiece surface.

Figure 14:
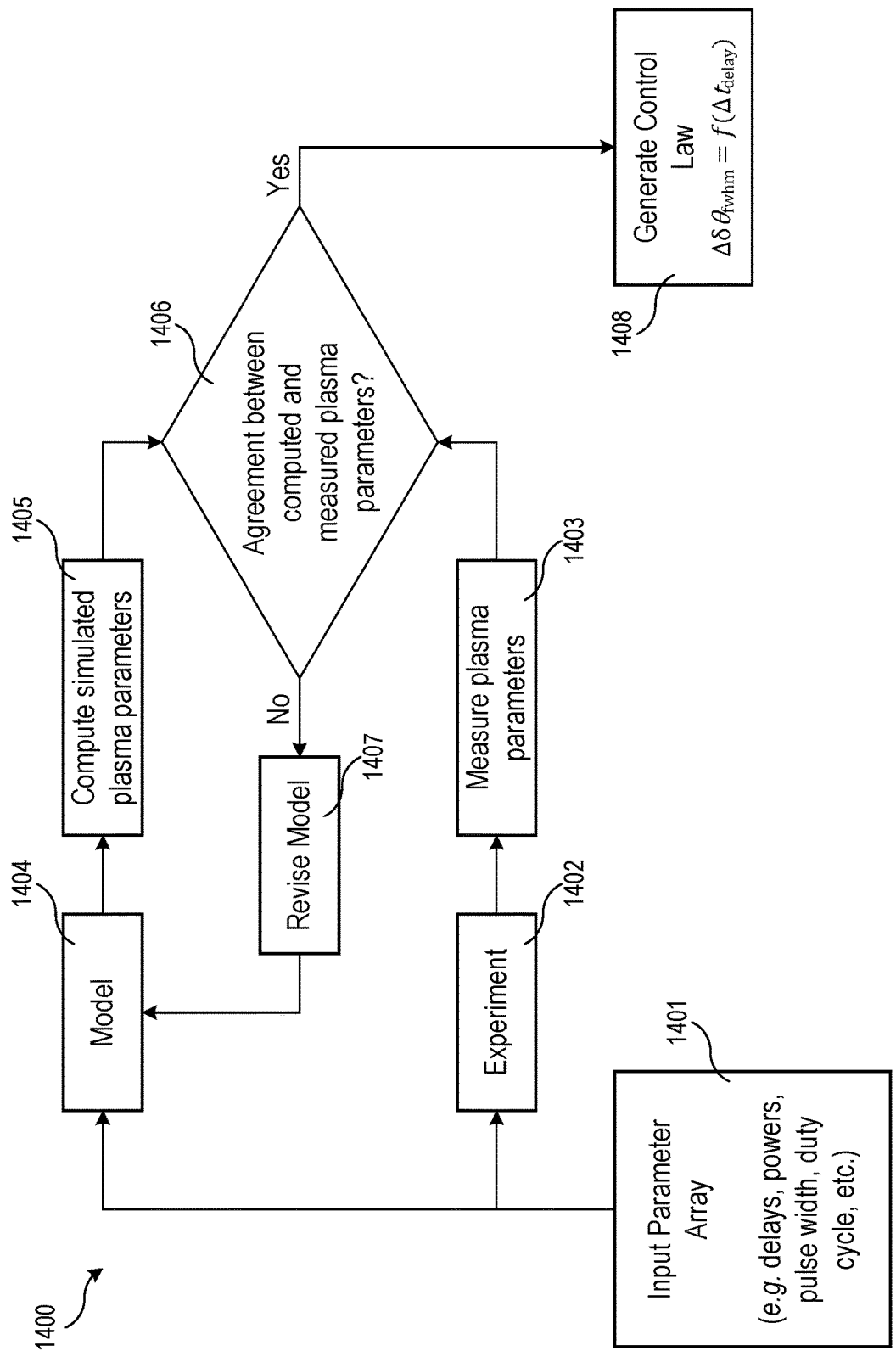
FIG. 14 illustrates a flowchart of an example method of generating a control law usable for active control of an ion angle distribution function during plasma processing in accordance with an embodiment of the invention.

FIG. 14 illustrates a flowchart of an example method of generating a control law usable for active control of an ion angle distribution function during plasma processing in accordance with an embodiment of the invention. The method of FIG. 14 may be used to determine appropriate delays and/or offsets for use in embodiment methods as described herein, such as the method of FIG. 1, for example, in order to achieve desired angular spreads during plasma processing. In-line control may be an unsuitable solution due to difficulties in measuring the ion angular distribution function (IADF). Instead, model based control of an IADF may be implemented as a solution in order to enable active control of the IADF.

Referring to FIG. 14, a flowchart 1400 for generating a control law includes step 1401 includes determining an input array of pulse modulation process parameters. For example, the input array may include various delays, powers, pulse widths, duty cycles, and the like. The input parameter array may be utilized in step 1402 during which an experiment may be conducted to determine the empirical results of the input parameter array for a given plasma processing system. Various plasma parameters may be measured in step 1403. For example, the plasma parameters may include maximum, minimum, and average energy of plasma species, ion energy distribution function (IEDF), ion angular distribution function (IADF), full-width at half maximum value of the ion angular distribution ($\delta\theta_{fwhm}$), developed critical dimension (DCD), etched critical dimension (ECD), and others at one or more positions in a plasma processing chamber. The measurements may be conducted by introducing a test wafer to best approximate actual process conditions.

The input parameter array may also be utilized in a plasma model in step 1404. For example, the plasma model may be a one-dimensional (1D) model that is specific to a plasma processing system in order to predict plasma parameters given a set of input parameters. The plasma model may also be a multi-dimensional model in some cases. The plasma model may be statistical and/or may include physics based models of the plasma in the plasma chamber. A set of simulated plasma parameters corresponding to the measured plasma parameters may be computed using the plasma model in step 1405.

In step 1406, the computed plasma parameters and the measured plasma parameters may be compared to determine the accuracy of the plasma model. For example, agreement may be determined between the computed and measured parameters if certain preselected parameters are within predetermined ranges. The identity of the preselected parameters and the predetermined ranges may depend on specific design details of a plasma process. If the computed and measured parameters are determined to be not in agreement in step 1406, the plasma model may be revised in step 1407. Model revisions may include adjustment of proportionality constants, altering of boundary conditions, and regression analysis, as well as replacement of a simple model with a more complex model. After the plasma model has been revised, the method returns back to step 1404.

If the measured and computed plasma parameters are found to be in agreement, a control law may be generated in step 1408. The control law may define a relationship between the change in ion angular distribution $\delta\theta_{fwhm}$ (denoted $\Delta\delta\theta_{fwhm}$) as a function of the change in one or more delay parameters $f(\Delta t_{delay})$. Specifically, the control law may advantageously allow accurate prediction of the change in the angular spread of an ion distribution for a given change in one or more delay parameters.

Figure 15:
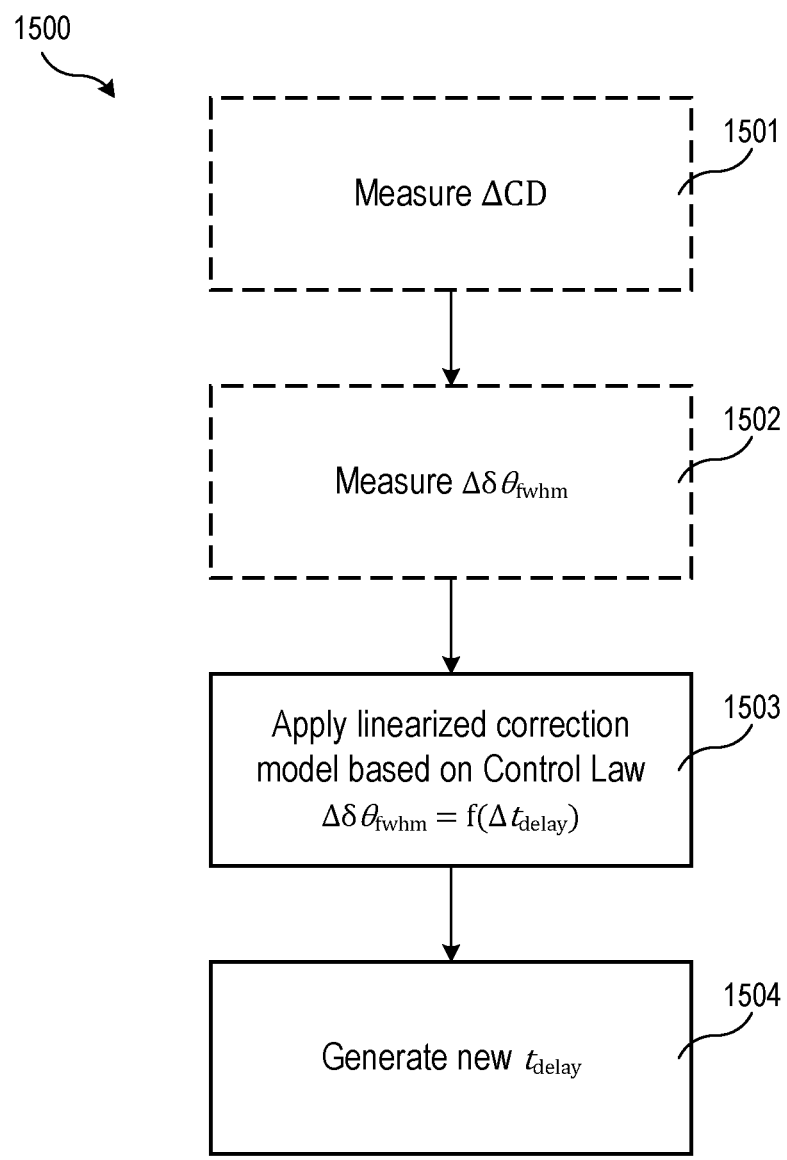
FIG. 15 illustrates a flowchart of an example method of feedforward control of a plasma process in accordance with an embodiment of the invention.

FIG. 15 illustrates a flowchart of an example method of feedforward control of a plasma process in accordance with an embodiment of the invention. For example, the method of FIG. 15 may be performed by a plasma processing system to control a plasma process in a feedforward manner by implementing a control law, such as may be determined by method of FIG. 14, for example. The feedforward control method may allow, for instance, control of a plasma processing system by determining new pulse delays based on expected and/or measured variation from desired values such as the variation of a critical dimension (CD), angular distribution, and the like.

Referring to FIG. 15, a flowchart 1500 for a method of feedforward control includes step 1501 of measuring the variation in a critical dimension $\Delta CD$. For example, the CD may be an ECD of a DCD of a particular plasma process. In some embodiments, step 1501 may measure multiple $\Delta CDs$ or step 1501 may be omitted. A step 1502 includes measuring the variation in an angular distribution $\Delta\delta\theta_{fwhm}$. Similar to step 1501, variations in angular distributions for multiple species may be measured in step 1502 in some embodiments. Alternatively, step 1502 may be omitted.

In step 1503 a correction model may be applied using a control law. In one embodiment, the correction model is a linear correction model. For example a control law may be predetermined using a suitable method such as the method of FIG. 14, as an example. Based on the results of the linear correction model, one or more new delay parameters $t_{delay}$ may be determined.

Figure 16:
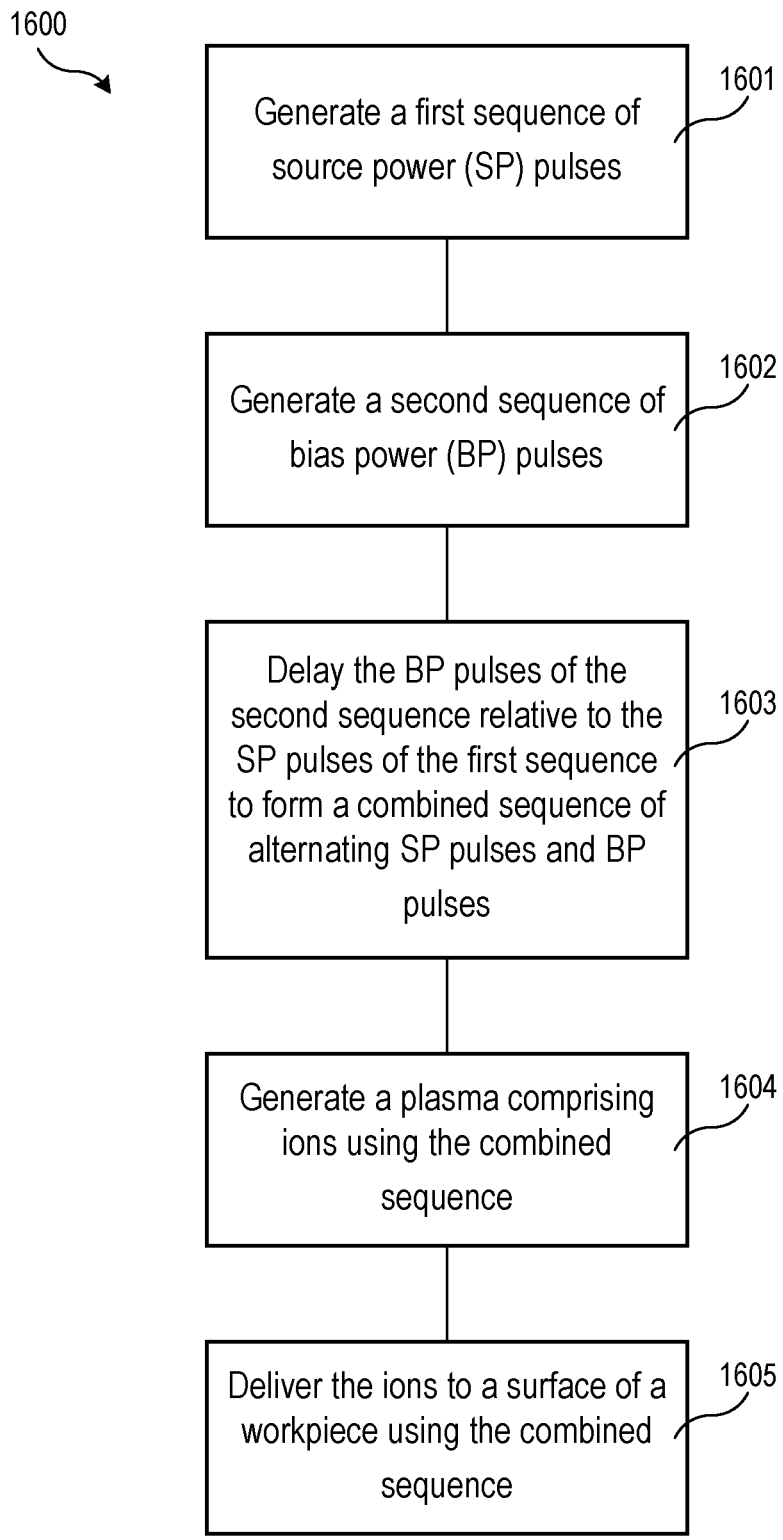
FIG. 16 illustrates an example method of control during plasma processing in accordance with an embodiment of the invention.

FIG. 16 illustrates an example method of control during plasma processing in accordance with an embodiment of the invention. It is noted that while the flowcharts of FIG. 14 and FIG. 15 are intended to illustrate a particular order of events, the method as shown in FIG. 16 is not intended to limit method steps to a particular order. Accordingly, the below method steps may be performed in any suitable order as may be apparent to a person of skill in the art.

Step 1601 of a method 1600 of control during plasma processing includes generating a first sequence of SP pulses. Step 1602 includes generating a second sequence of BP pulses. The SP pulses and BP pulses may be generated with various pulse modulation parameters in accordance with any of the embodiment methods described herein, such as the method of FIG. 1, for example. Further, the SP pulses and BP pulses may be formed using any of the embodiment systems described herein, such as the system of FIG. 2, for example. In one embodiment, the SP pulses are generated using a pulse modulation circuit. The pulse modulation circuit may be included in a controller.

Step 1603 of the method 1600 of control during plasma processing includes delaying the BP pulses of the second sequence relative to the SP pulses of the first sequence to form a combined sequence of alternating SP pulses and BP pulses. For example, each SP pulse may be followed by a BP pulse while each BP pulse is followed by an SP pulse. In one embodiment, the BP pulses are delayed using a timing circuit. The timing circuit may be included in the controller.

Step 1604 includes generating a plasma comprising ions using the combined sequence and step 1605 includes delivering the ions to a surface of a workpiece using the combined sequence. The combined sequence may be used to generate a plasma in a plasma processing chamber. The plasma may include ions and the combined sequence may be further used to deliver the ions to a surface of a workpiece.

Figure 17:
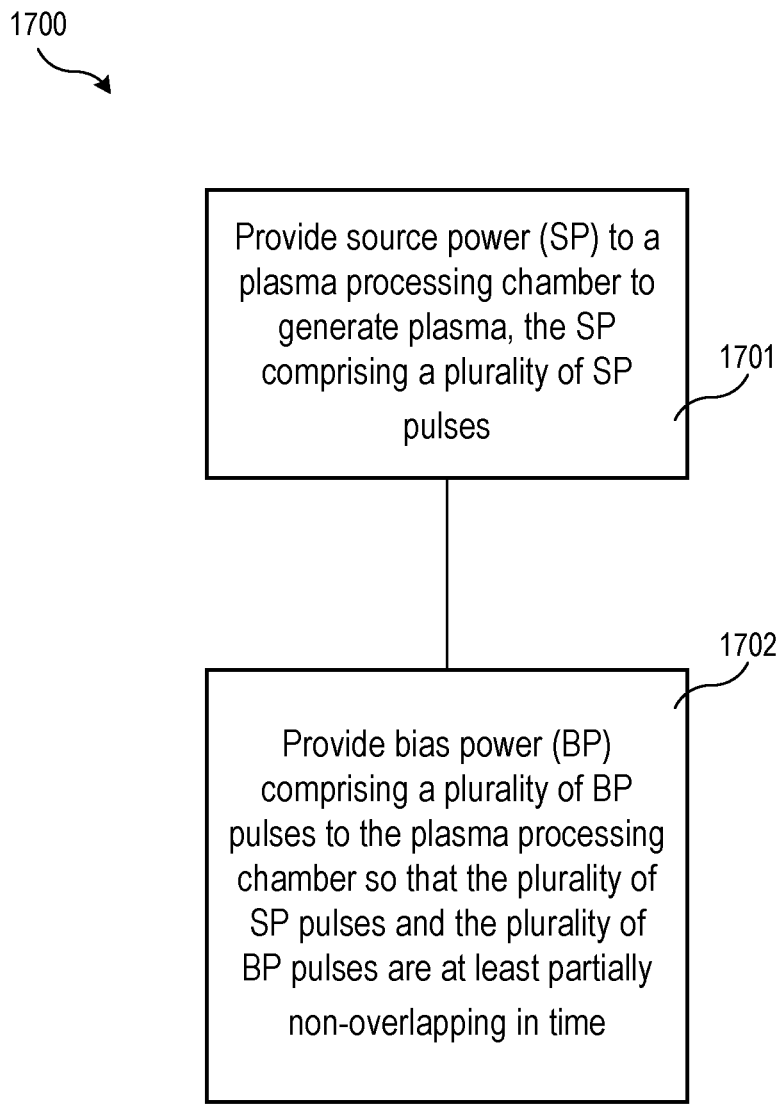
FIG. 17 illustrates an example method of plasma processing in accordance with an embodiment of the invention.
Figure 18:
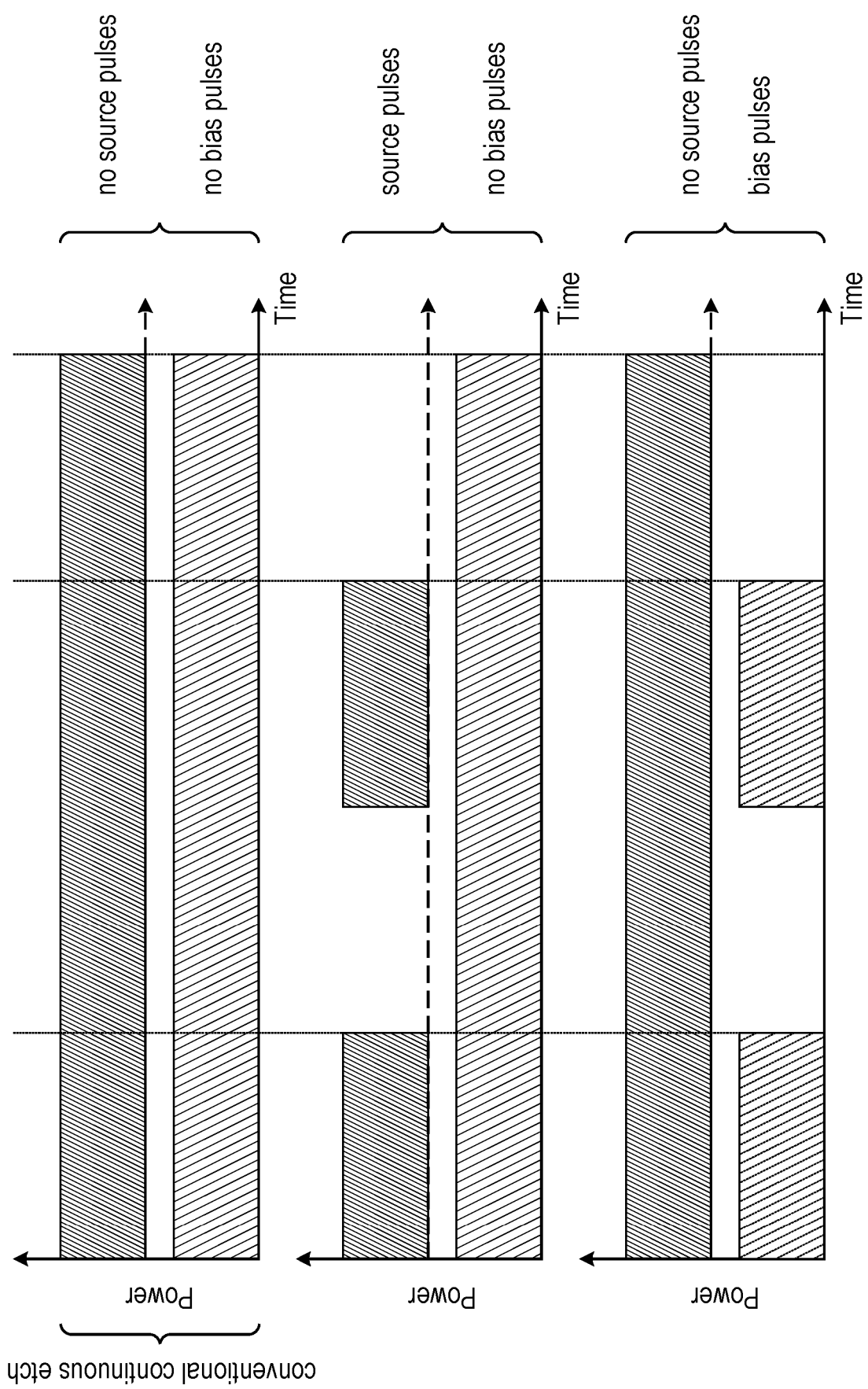
FIG. 18 illustrates several conventional timing diagrams including source power and bias power.

FIG. 17 illustrates an example method of plasma processing in accordance with an embodiment of the invention. It is noted that while the flowcharts of FIG. 14 and FIG. 15 are intended to illustrate a particular order of events, the method as shown in FIG. 17 is not intended to limit method steps to a particular order. Accordingly, the below method steps may be performed in any suitable order as may be apparent to a person of skill in the art.

Step 1701 of a method 1700 of plasma processing includes providing source power to a plasma processing chamber to generate plasma. The source power includes a plurality of SP pulses. The SP pulses may be generated with various pulse modulation parameters in accordance with any of the embodiment methods described herein, such as the method of FIG. 1, for example. Further, the SP pulses may be formed using any of the embodiment systems described herein, such as the system of FIG. 2, for example.

Step 1702 of the method 1700 of plasma processing includes providing bias power to the plasma processing chamber. The bias power includes a plurality of BP pulses which are at least partially non-overlapping in time. In various embodiments, the SP pulses and the BP pulses are completely non-overlapping in time. The BP pulses may be generated with various pulse modulation parameters in accordance with any of the embodiment methods described herein, such as the method of FIG. 1, for example. Further, the BP pulses may be formed using any of the embodiment systems described herein, such as the system of FIG. 2, for example.

The embodiments as described herein may advantageously control the angle of incidence of ions at the microelectronic workpiece surface by controlling the timing between source pulses and bias pulses. For example, the angle of incidence of a given ion arriving at the surface of the microelectronic workpiece is a combination of a substantially vertical velocity imparted to the ion by the bias power and a random velocity due to the temperature of the ion. The temperature of ion increases with the source power during plasma generation and decreases if the source power is turned off. The embodiments may also beneficially enable flexibility in the application of source power and bias power to the plasma processing chamber such that the substantially vertical velocity is increased and the random velocity is decreased.

The embodiments described herein may also provide the benefit of limiting plasma generation to a specific period of time. For example, application of high frequencies to a plasma afterglow phase may result in electron and ion heating as well as plasma generation. Further, the embodiments may advantageously allow bias power pulses while the source power is off so that ions are accelerated in the afterglow phase without additional plasma generation or heating. This may beneficially result in increased control over ion energy in addition to controlling the angular distribution of the ions.

A further advantage of the described embodiments may be flexible application of bias power including low frequency RF power (e.g., <400 kHz), DC power pulses, or alternating polarity DC voltage pulses, as examples. Lower frequency bias power pulses and/or DC bias power pulses may have increased effectiveness as a result of the source power being off. Alternating polarity DC pulses may advantageously prevent electric charge from building up on a substrate being processed. For example, if a substrate of a microelectronic workpiece includes dielectric layers, alternating polarity DC bias power pulses may decrease or eliminate undesirable electric charging the substrate.

Another possible benefit of the described embodiments is to maintain a constant particle flux directed toward a microelectronic workpiece. For example, the source power pulse off time may be chosen so that ions and other desirable particles such as radicals reach a surface of the microelectronic workpiece at a consistent rate. Several parameters may be considered when choosing the source power off time including the diffusion and sticking coefficients of a particular species and the critical dimension of the plasma processing chamber, among others.

Example embodiments of the invention are summarized here. Other embodiments can also be understood from the entirety of the specification as well as the claims filed herein.

Example 1

A method of plasma processing, the method including generating a first sequence of source power (SP) pulses; generating a second sequence of bias power (BP) pulses; combining the BP pulses of the second sequence with the SP pulses of the first sequence to form a combined sequence of alternating SP pulses and BP pulses; and using the combined sequence, generating a plasma including ions and processing a substrate by delivering the ions to a major surface of the substrate.

Example 2

The method of example 1, further including adjusting an offset duration between trailing edges of the SP pulses and leading edges of the BP pulses.

Example 3

The method of one of examples 1 and 2, further including adjusting a pulse width duration of the BP pulses of the second sequence.

Example 4

The method of one of examples 1 to 3, further including adjusting an off-time duration between SP pulses of the first sequence.

Example 5

The method of one of examples 1 to 4, further including generating a third sequence of potential control power (PCP) pulses, where the PCP pulses of the third sequence overlap in time with the alternating SP pulses and BP pulses of the combined sequence.

Example 6

The method of example 5, where the PCP pulses include negative direct current (DC) pulses, and where the negative DC pulses are provided to the plasma during the SP pulses.

Example 7

The method of example 5, where the PCP pulses include positive direct current (DC) pulses, and where the positive DC pulses are provided to the plasma during the BP pulses.

Example 8

The method of one of examples 1 to 7, further including providing a stream of electrons at the plasma during the alternating SP pulses and BP pulses of the combined sequence.

Example 9

A method of plasma processing including providing source power (SP) to a plasma processing chamber to generate a plasma, the SP including a plurality of SP pulses; and providing bias power (BP) including a plurality of BP pulses to the plasma processing chamber, where the plurality of SP pulses and the plurality of BP pulses are combined to form a pulse sequence, where each pulse of the pulse sequence includes a SP pulse of the plurality of SP pulses and a BP pulse of the plurality of BP pulses, and an interval of time during which either a portion of the SP pulse or a portion of the BP pulse is in a high amplitude state.

Example 10

The method of example 9, where the SP includes alternating current (AC) power at a first frequency; the BP includes AC power at a second frequency; and the second frequency is less than the first frequency.

Example 11

The method of example 10, where the first frequency is greater than about 10 MHz and the second frequency is less than about 5 MHz.

Example 12

The method of example 10, where the second frequency is less than about 400 kHz.

Example 13

The method of example 9, where the SP includes alternating current (AC) power; and the BP includes direct current (DC) power.

Example 14

The method of example 13, where, providing SP and BP to the plasma processing chamber includes alternating the SP pulses of the plurality of SP pulses with the BP pulses of the plurality of BP pulses; and where each of the plurality of BP pulses includes a single DC pulse.

Example 15

The method of example 13, where each of the plurality of BP pulses includes alternating polarity DC pulses.

Example 16

The method of one of examples 9 to 15, where the pulse sequence is a periodic sequence, where providing the SP and the BP to the plasma processing chamber includes delivering the periodic sequence including the plurality of SP pulses and the plurality of BP pulses to the plasma processing chamber; each cycle of the periodic sequence includes exactly one SP pulse of the plurality of SP pulses; and a duty cycle of each of the plurality of SP pulses is about 50%.

Example 17

The method of example 16, where each cycle of the periodic sequence includes exactly one BP pulse of the plurality of BP pulses; and providing the SP and the BP to the plasma processing chamber includes delaying each of the plurality of BP pulses so that a duty cycle of each of the plurality of BP pulses is less than 50%.

Example 18

A plasma processing system including a controller configured to generate a first sequence of source power (SP) pulses and a second sequence of bias power (BP) pulses, and combine the BP pulses of the second sequence with the SP pulses of the first sequence to form a combined sequence of alternating SP pulses and BP pulses; and a plasma processing chamber coupled to the controller and configured to generate a plasma including ions generated using the combined sequence, the plasma processing chamber configured to support a substrate for receiving the generated ions.

Example 19

The system of example 18, where the controller is further configured to adjust an offset duration between trailing edges of the SP pulses and leading edges of the BP pulses, adjust a pulse width duration of the BP pulses of the second sequence, or adjust an off-time duration between SP pulses of the first sequence.

Example 20

The system of one of examples 18 and 19, where the controller is further configured to generate a third sequence of potential control power (PCP) pulses, where the PCP pulses of the third sequence overlap in time with the alternating SP pulses and BP pulses of the combined sequence.

The power control techniques as described herein may be controlled by a controller. It is also noted that the controller may be implemented using one or more programmable integrated circuits that are programmed to provide the functionality described herein. For example, one or more processors (e.g., microprocessor, microcontroller, central processing unit, etc.), programmable logic devices (e.g., CPLD (complex programmable logic device), FPGA (field programmable gate array), etc.), and/or other programmable integrated circuits may be programmed with software or other programming instructions to implement any of the functionality described herein. It is further noted that the software or other programming instructions may be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions, when executed by the programmable integrated circuits, cause the programmable integrated circuits to perform the processes, functions, and/or capabilities described herein. Other variations of the above could also be implemented.

One or more deposition processes may be used to form material layers described herein. For example, one or more depositions may be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture may be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to photoresist (PR) layers may be implemented using optical lithography, extreme ultraviolet (EUV) lithography, and/or other lithography processes. The etch processes may be implemented using plasma etch processes, discharge etch processes, and/or other desired etch processes. For example, plasma etch processes may be implemented using plasma containing fluorocarbons, oxygen, nitrogen, hydrogen, argon, and/or other gases. In addition, operating variables for process steps may be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations of the above may also be implemented while still taking advantage of the techniques described herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the embodiments of FIGS. 8, 10, and 12 may be combined in further embodiments. Similarly, embodiments described with respect to FIG. 2 such as FIGS. 2-7 may be combined with FIG. 9, 11, or 13. It is therefore intended that the appended claims encompass any such modifications or embodiments.

What is claimed is:

1. A method of plasma processing, the method comprising:
generating a first sequence of source power (SP) pulses;
generating a second sequence of bias power (BP) pulses;
generating a plurality of offset durations triggered by the SP pulses of the first sequence at a controller of a plasma processing system to delay the BP pulses relative to the SP pulses and form a combined sequence of alternating SP pulses and BP pulses, each offset duration being between a trailing edge of one SP pulse of the first sequence and a leading edge of a corresponding BP pulse of the second sequence;
generating a plasma comprising ions using the SP pulses of the combined sequence; and
processing a substrate in a plasma processing system by delivering the ions to a major surface of the substrate using the BP pulses of the combined sequence,
wherein no source power is provided to the plasma processing system during the BP pulses.

2. The method of claim 1, further comprising:
adjusting a pulse width duration of the BP pulses of the second sequence.

3. The method of claim 1, further comprising:
adjusting an off-time duration between the SP pulses of the first sequence.

4. The method of claim 1, further comprising:
generating a third sequence of potential control power (PCP) pulses, wherein the PCP pulses of the third sequence are direct current (DC) pulses that overlap in time with the alternating SP pulses and BP pulses of the combined sequence.

5. The method of claim 4, wherein:
the PCP pulses are negative DC pulses, the negative DC pulses being provided to the plasma during the SP pulses; or
the PCP pulses are positive DC pulses, the positive DC pulses being provided to the plasma during the BP pulses.

6. The method of claim 1, further comprising:
providing a stream of electrons at the plasma during the alternating SP pulses and BP pulses of the combined sequence.

7. The method of claim 1, wherein each SP pulse with corresponding offset duration and corresponding BP pulses of the combined sequence totals less than 200 µs.

8. The method of claim 1, wherein:
generating the plasma comprises generating glow phases of the plasma comprising the ions using the SP pulses of the combined sequence; and
processing the substrate comprises processing the substrate in the plasma processing system using the BP pulses of the combined sequence during afterglow phases of the plasma.

9. The method of claim 1, further comprising:
generating a third sequence of electron-beam (e-beam) control power (eCP) pulses, wherein the eCP pulses of the third sequence overlap in time with the SP pulses of the first sequence.

10. The method of claim 1, further comprising:
generating a third sequence of grid control power (GCP) pulses, wherein the GCP pulses of the third sequence overlap in time with the alternating SP pulses and BP pulses of the combined sequence.

11. A method of plasma processing comprising:
providing radio frequency (RF) source power (SP) to an SP coupling element of a plasma processing chamber of a plasma processing system to generate a plasma, the RF SP comprising a first frequency greater than about 10 MHz and a plurality of SP pulses; and providing bias power (BP) comprising a plurality of BP pulses to the plasma processing chamber to process a substrate in the plasma processing chamber, each of the BP pulses comprising periodic time-varying BP having a second frequency less than about 5 MHz, wherein the plurality of SP pulses and the plurality of BP pulses are combined to form an antisynchronous periodic pulse sequence, wherein each cycle of the antisynchronous periodic pulse sequence comprises exactly one SP pulse of the plurality of SP pulses and exactly one BP pulse of the plurality of BP pulses, wherein each cycle of the antisynchronous periodic pulse sequence is less than 200 µs, and wherein no source power is provided to the plasma processing system during the BP pulses.

12. The method of claim 11, wherein the second frequency is less than about 400 kHz.

13. The method of claim 11, wherein each of the plurality of BP pulses comprises a plurality of direct current (DC) power pulses.

14. The method of claim 13, wherein each plurality of DC power pulses comprises alternating polarity DC pulses.

15. The method of claim 11, wherein a duty cycle of each of the plurality of SP pulses is about 50%.

16. The method of claim 15, wherein providing the SP and the BP to the plasma processing chamber comprises delaying each of the plurality of BP pulses so that a duty cycle of each of the plurality of BP pulses is less than about 4%.

17. A plasma processing system comprising:
a controller configured to
generate a first sequence of source power (SP) pulses and a second sequence of bias power (BP) pulses, and
generate a plurality of offset durations triggered by the SP pulses of the first sequence to delay the BP pulses relative to the SP pulses and form a combined sequence of alternating SP pulses and BP pulses, each offset duration being between a trailing edge of one SP pulse of the first sequence and a leading edge of a corresponding BP pulse of the second sequence; and a plasma processing chamber coupled to the controller and configured to
generate a plasma comprising ions using the SP pulses of the combined sequence, and
support a substrate for receiving the ions generated during using the BP pulses of the combined sequence, wherein no source power is provided to the plasma processing system during the BP pulses.

18. The system of claim 17, wherein the controller is further configured to:
adjust a pulse width duration of the BP pulses of the second sequence, or
adjust an off-time duration between SP pulses of the first sequence.

19. The system of claim 17, wherein the controller is further configured to generate a third sequence of potential control power (PCP) pulses, and wherein the PCP pulses of the third sequence are direct current (DC) pulses that overlap in time with the alternating SP pulses and BP pulses of the combined sequence.

20. The system of claim 17, wherein the controller is further configured to generate a third sequence of electron-beam (e-beam) control power (eCP) pulses, and wherein the eCP pulses of the third sequence overlap in time with the SP pulses of the first sequence.

* * * * *

UNITED STATES PATENT AND TRADEMARK OFFICE
CERTIFICATE OF CORRECTION

PATENT NO. : 10,998,169 B2
APPLICATION NO. : 16/221971
DATED : May 4, 2021
INVENTOR(S) : Peter Ventzek Page 1 of 1

It is certified that error appears in the above-identified patent and that said Letters Patent is hereby corrected as shown below:

In the Claims

In Column 27, Line 31, Claim 16, delete "about 4%" and insert --about 40%--.

In Column 28, Line 15, Claim 17, delete "during".

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*